United States Patent
Valenti et al.

(10) Patent No.: US 12,124,117 B2
(45) Date of Patent: Oct. 22, 2024

(54) OPTICAL LENS HAVING A FILTERING INTERFERENTIAL COATING AND A MULTILAYER SYSTEM FOR IMPROVING ABRASION-RESISTANCE

(71) Applicant: Essilor International, Charenton-le-Pont (FR)

(72) Inventors: Christophe Valenti, Charenton-le-Pont (FR); Frédéric Guillain, Charenton-le-Pont (FR); William Trottier-Lapointe, Charenton-le-Pont (FR)

(73) Assignee: Essilor International, Charenton-le-Pont (FR)

( * ) Notice: Subject to any disclaimer, the term of this patent is extended or adjusted under 35 U.S.C. 154(b) by 608 days.

(21) Appl. No.: 17/293,296

(22) PCT Filed: Nov. 18, 2019

(86) PCT No.: PCT/EP2019/081686
§ 371 (c)(1),
(2) Date: May 12, 2021

(87) PCT Pub. No.: WO2020/104392
PCT Pub. Date: May 28, 2020

(65) Prior Publication Data
US 2022/0011601 A1    Jan. 13, 2022

(30) Foreign Application Priority Data
Nov. 19, 2018 (EP) .................................... 18306521

(51) Int. Cl.
*G02C 7/10* (2006.01)
*G02B 1/116* (2015.01)
(Continued)

(52) U.S. Cl.
CPC .............. *G02C 7/107* (2013.01); *G02B 1/116* (2013.01); *G02C 7/022* (2013.01); *G02C 7/024* (2013.01); *C23C 14/081* (2013.01)

(58) Field of Classification Search
CPC ........ G02C 7/107; G02C 7/022; G02C 7/024; G02B 1/116; G02B 1/115; C23C 14/081; B29D 11/00865
(Continued)

(56) References Cited

U.S. PATENT DOCUMENTS 7,692,855 B2    4/2010    Arrouy et al.
8,982,466 B2    3/2015    Neuffer
(Continued)

FOREIGN PATENT DOCUMENTS

CN    104903756    9/2015
CN    101512389    8/2019
(Continued)

OTHER PUBLICATIONS

Search Report issued in corresponding Chinese Application No. 2019800757421, dated Nov. 8, 2022.
(Continued)

*Primary Examiner* — Tuyen Tra
(74) *Attorney, Agent, or Firm* — Norton Rose Fulbright US LLP

(57) ABSTRACT

The invention relates to an optical lens comprising a substrate having a front main face and a rear main face, at least one main face of which being successively coated with a first high refractive index sheet which does not comprise any $Ta_2O_5$ layer, a second low refractive index sheet a third high refractive index sheet, a monolayer sub-layer having a thickness higher than or equal to 100 nm, a multilayer interferential coating comprising a stack of at least one high refractive index layer and at least one low refractive index (Continued)

Figure 1:
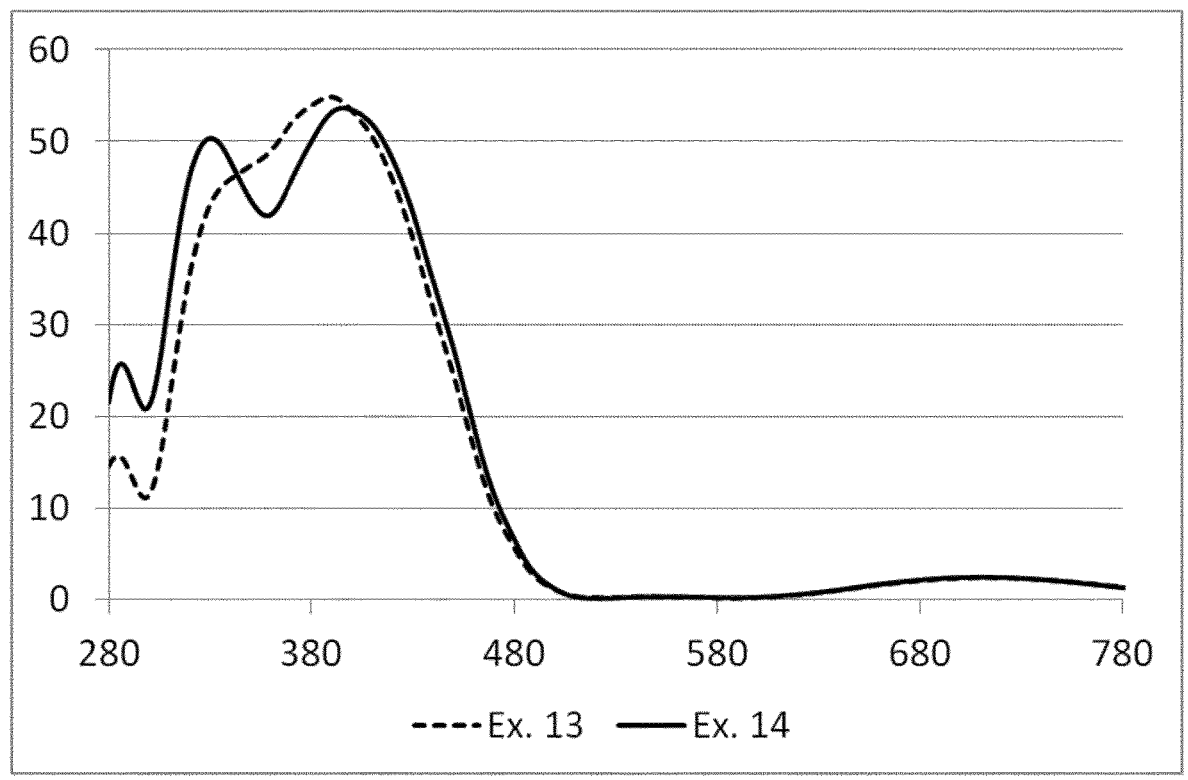

layer, and a filtering interferential system that selectively reflects or transmits visible light in a narrow range of wavelengths.

20 Claims, 2 Drawing Sheets

(51) Int. Cl.
G02C 7/02 (2006.01)
C23C 14/08 (2006.01)

(58) Field of Classification Search
USPC .................................. 351/41, 159.01, 159.6
See application file for complete search history.

(56) References Cited

U.S. PATENT DOCUMENTS

| | | | |
|---|---|---|---|
| 11,828,961 | B2 | 11/2023 | Chen et al. |
| 2008/0206470 | A1 | 8/2008 | Thomas et al. |
| 2010/0238557 | A1 | 9/2010 | Tomoda |
| 2014/0347625 | A1 | 11/2014 | Tomoda et al. |
| 2015/0241602 | A1 | 8/2015 | Avetisian et al. |
| 2016/0154254 | A1 | 6/2016 | Bolshakov et al. |
| 2016/0187673 | A1 | 6/2016 | Maitre et al. |
| 2017/0003520 | A1 | 1/2017 | Iwasaki et al. |
| 2017/0075040 | A1 | 3/2017 | Bolshakov et al. |
| 2017/0235020 | A1 | 8/2017 | Bolshakov |
| 2017/0274221 | A1 | 9/2017 | Barrau et al. |
| 2017/0351119 | A1 | 12/2017 | Passard et al. |
| 2018/0067338 | A1 | 3/2018 | Hofener et al. |
| 2018/0231689 | A1 | 8/2018 | Chiarotto |
| 2018/0259682 | A1 | 9/2018 | Scherschlicht et al. |

FOREIGN PATENT DOCUMENTS

| | | |
|---|---|---|
| EP | 2775341 | 9/2014 |
| EP | 3151041 | 4/2017 |
| EP | 3185050 | 6/2017 |
| EP | 3242150 | 11/2017 |
| EP | 3301488 | 4/2018 |
| JP | 2002122820 | 4/2002 |
| JP | 2003195003 | 7/2003 |
| JP | 2003294906 | 10/2003 |
| JP | 2013205805 | 10/2013 |
| WO | WO 2012/076714 | 6/2012 |
| WO | WO 2013/171434 | 11/2013 |
| WO | WO 2014/208412 | 12/2014 |
| WO | WO 2015001278 | 1/2015 |
| WO | WO 2016/102857 | 6/2016 |
| WO | WO 2017/125999 | 7/2017 |
| WO | WO 2018/192998 | 10/2018 |
| WO | WO 2020/104381 | 5/2020 |
| WO | WO 2020/104388 | 5/2020 |
| WO | WO 2020/104391 | 5/2020 |

OTHER PUBLICATIONS

"Ophthalmic Optics—Spectacle Lenses—Vocabulary" International Standard—ISO 1998, 13666, 51-52.

International Search Report and Written Opinion issued in Corresponding PCT application No. PCT/EP2019/081673, dated Jun. 15, 2020.

International Search Report and Written Opinion issued in Corresponding PCT application No. PCT/EP2019/081685, dated Feb. 24, 2020.

International Search Report and Written Opinion issued in Corresponding PCT application No. PCT/EP2019/081686, dated Aug. 3, 2020.

International Search Report issued in Corresponding PCT application No. PCT/EP2019/081681, dated Jun. 3, 2020.

Office Action issued in corresponding Japanese Application No. 2021-527194, dated Dec. 12, 2023.

OPTICAL LENS HAVING A FILTERING INTERFERENTIAL COATING AND A MULTILAYER SYSTEM FOR IMPROVING ABRASION-RESISTANCE

CROSS-REFERENCE TO RELATED APPLICATIONS

This application is a national phase application under 35 U.S.C. § 371 of International Application No. PCT/EP2019/081686 filed 18 Nov. 2019, which claims priority to European Patent Application No. 18306521.8 filed 19 Nov. 2018. The entire contents of each of the above-referenced disclosures is specifically incorporated by reference herein without disclaimer.

The invention relates to an optical article comprising a substrate coated with a multilayer transparent interferential coating, typically a selective filtering coating, having an improved abrasion resistance and good thermal resistance, in particular an ophthalmic lens, and a method of manufacturing such optical article.

It is a common practice in the art to coat at least one main surface of an optical substrate with several coatings for imparting to the finished article additional or improved optical or mechanical properties. These coatings are designated in general as functional coatings.

The various coatings that may be used to impart a plurality of mechanical and/or optical properties may be impact-resistant coating layers, abrasion- and/or scratch-resistant coating layers, anti-reflection and/or reflective coating layers, and/or anti-fouling layers and/or anti-fog layers.

Different ways to improve the abrasion resistance of an optical article, which is sensitive to scratches from environment, can be found in the literature. For instance, it has been proposed to use a relatively thick sub-layer below the antireflection coating, or increase the total thickness of the anti-reflection coating, such as in JP 2003-195003 and JP 2003-294906, where a lens coated with a primer coating, a hard coat and a 7-layer anti-reflection coating comprising alternated layers of $SiO_2$ and $TiO_2$, the latter being deposited with ion assistance and known to be sensitive to photo-degradation, is described. In JP 2003-294906, it is advised to control the film thicknesses of the first three layers of the antireflection coating (counted from the substrate side), and to use a high ratio of (sum of the physical thicknesses of the $SiO_2$ layers)/(sum of the physical thicknesses of the $TiO_2$ layers) calculated for the first three layers.

U.S. Pat. No. 8,982,466 relates to an optical lens having a hard coat and a multilayer anti-reflection coating in which the high-refractive-index layers, made of $TiO_2$, together have a thickness of less than 40 nm.

EP 2775341 discloses an eyeglass lens having a hard coat layer, a 360-390 nm thick $SiO_2$ sub-layer and a 4-layer interferential coating made of $SiO_2$, $ZrO_2$ and/or $Ta_2O_5$, in which the layers have a specific nanoindentation hardness and compressive stress, and have generally been deposited by ion-assisted vapor deposition. This deposition technique increases compressive stress and as a result may lead to delamination.

JP 2002-122820 describes a hard-coated substrate coated with a $SiO_2$ sub-layer having a physical thickness of 89-178 nm (optical thickness: 0.25-0.5λ, at 520 nm) and a 4-layer anti-reflection coating ($ZrO_2/SiO_2/ZrO_2/SiO_2$). According to this document, high critical temperatures can be reached by being able to balance coating thickness and stress between the layers of the various materials. However, the only parameter which was studied was the thickness of the sub-layer. Its thickness should be such that the ratio (sum of the physical thicknesses of the $SiO_2$ layers, including the sub-layer)/(sum of the physical thicknesses of the $ZrO_2$ layers) ranges from 2 to 3. Higher ratios are said to be undesirable because the durability of the anti-reflection coating is decreased.

U.S. Pat. No. 7,692,855 discloses an optical article having anti-reflection properties and high thermal resistance, comprising a substrate having at least one main face coated with a multilayer anti-reflection coating in which the ratio of physical thickness of low refractive index layers/high refractive index layers is generally higher than 2.1.

US 2008/206470 relates to a process for manufacturing an optical article having antireflection or reflective properties, comprising a sub-layer a sub-layer and a multilayer stack. In order to increase the abrasion resistance of the optical article, the sub-layer has to be deposited in a vacuum chamber with an additional gas supply during the deposition step, and the exposed surface of the sub-layer has to be submitted to an ionic bombardment treatment prior to depositing the multilayer stack.

WO 2018/192998 suggests the control of the thicknesses of the layers in an interferential coating in order to increase abrasion resistance of an optical article, i.e., the use of a ratio of physical thickness of external low refractive index layer(s)/external high refractive index layer(s) higher than or equal to 2. Further, the optical article may comprise an impedance coating to limit interference fringes. Typically, in this instance, the impedance coating comprises, deposited in this order onto the optionally coated substrate, a 4-50 nm-thick $SiO_2$ layer, and a 4-15 nm-thick $ZrO_2$ or $Ta_2O_5$ layer, which is in contact with the sub-layer.

An objective of the current invention is to provide a transparent optical article comprising an organic or mineral glass substrate bearing an interferential coating, preferably a lens, and more preferably an ophthalmic lens for eyeglasses, having an improved abrasion resistance, a good adhesion to the substrate and a good resistance to heat and temperature variations, i.e., a high critical temperature, which would be an alternative to already known reflective or antireflective coated optical articles. These properties should be obtained without decreasing the optical performances and other mechanical performances of said article, such as anti-reflection or reflection performances.

Another aim of this invention is to provide a process of manufacturing the above defined article, which could be easily integrated into the classical manufacturing chain and would avoid heating the substrate.

The inventors have found that these objectives could be achieved by using a specific combination of layers deposited under a thick sub-layer of the interferential coating. This allows in particular to boost the abrasion resistance of the optical article without decreasing the adherence properties of the interferential coating.

Compared to classical interferential coatings, inventive interferential coatings have a higher abrasion resistance, a better adherence and similar or improved critical temperature.

Thus, the present invention relates to an optical lens comprising a substrate having a front main face and a rear main face, at least one main face of which being successively coated with:

(A) a first high refractive index sheet having a refractive index higher than 1.55, which does not comprise any $Ta_2O_5$ layer, (B) a second low refractive index sheet having a refractive index of 1.55 or less in direct contact with the former sheet, (C) a third high refractive index sheet having a refractive index higher than 1.55 in direct contact with the former sheet, a monolayer sub-layer having a thickness higher than or equal to 100 nm in direct contact with the former sheet (C), a multilayer interferential coating comprising a stack of at least one high refractive index layer having a refractive index higher than 1.55 and at least one low refractive index layer having a refractive index of 1.55 or less, and at least one main face of the substrate is coated with a filtering interferential coating that selectively reflects visible light (380-780 nm) in a range of wavelengths, and the reflection spectrum of said filtering interferential coating has a reflection peak centered at a wavelength chosen within said range of wavelengths that exhibits a full width at half maximum lower than 150 nm, preferably lower than 120 nm, or at least one main face of the substrate is coated with a filtering interferential coating that selectively transmits visible light (380-780 nm) in a range of wavelengths, and the transmission spectrum of said filtering interferential coating has a transmission peak centered at a wavelength chosen within said range of wavelengths that exhibits a full width at half maximum lower than 150 nm, preferably lower than 120 nm.

The system composed of sheets (A), (B) and (C) and the sub-layer is used herein as a mechanical and adherence system, while the interferential coating is used as an optical system.

Figure 2:
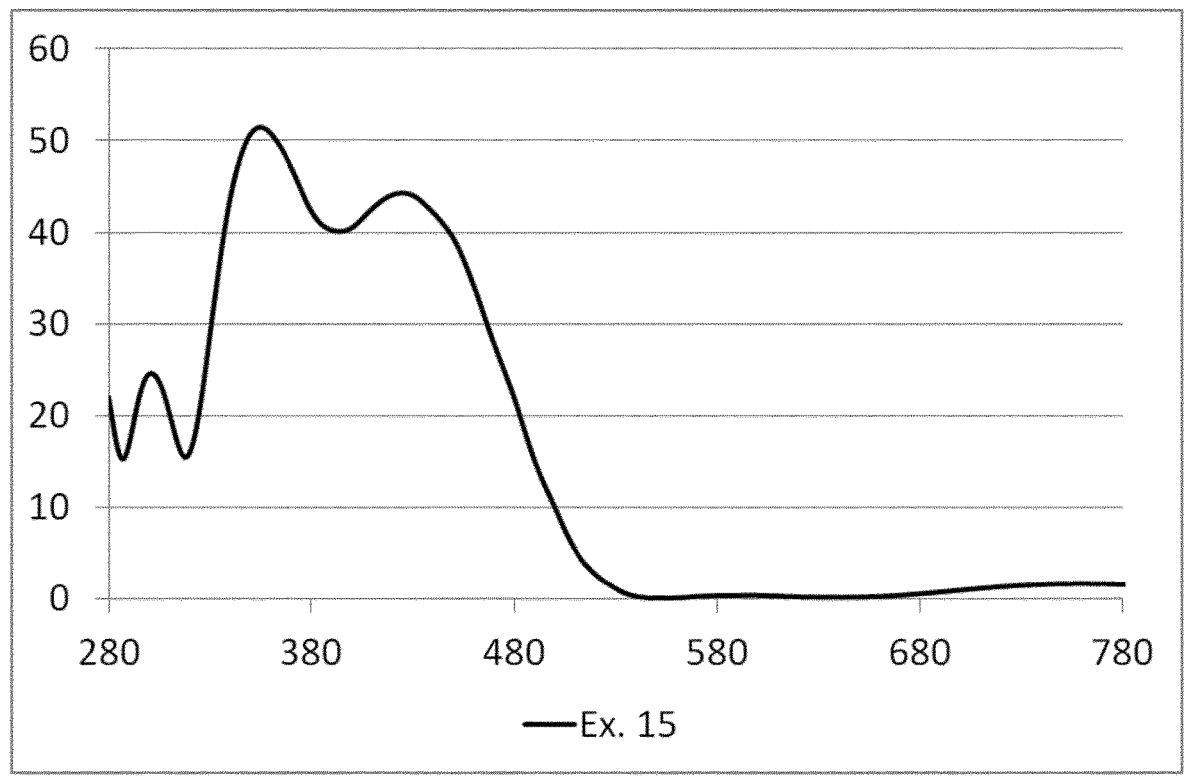
Figure 3:
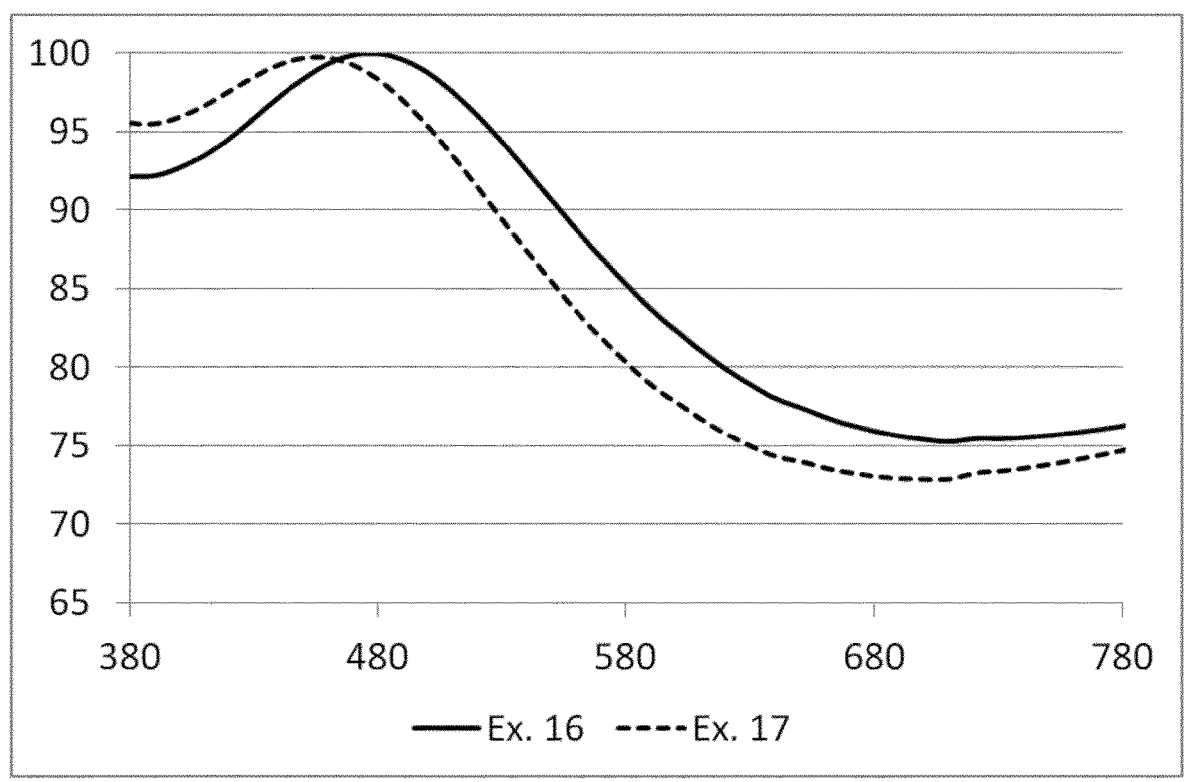

The foregoing and other objects, features and advantages of the present invention will become readily apparent to those skilled in the art from a reading of the detailed description hereafter when considered in conjunction with the accompanying drawing, wherein FIGS. 1 and 2 depict reflection curves between 280 and 780 nm for the filtering interferential coatings present on the front main face of the lenses of examples 13-15, while FIG. 3 depicts transmission curves between 380 and 780 nm for the filtering interferential coating present on the front main face of the lenses of examples 16-17.

DETAILED DESCRIPTION OF THE INVENTION

The terms "comprise" (and any grammatical variation thereof, such as "comprises" and "comprising"), "have" (and any grammatical variation thereof, such as "has" and "having"), "contain" (and any grammatical variation thereof, such as "contains" and "containing"), and "include" (and any grammatical variation thereof, such as "includes" and "including") are open-ended linking verbs. They are used to specify the presence of stated features, integers, steps or components or groups thereof, but do not preclude the presence or addition of one or more other features, integers, steps or components or groups thereof. As a result, a method, or a step in a method, that "comprises," "has," "contains," or "includes" one or more steps or elements possesses those one or more steps or elements, but is not limited to possessing only those one or more steps or elements.

Unless otherwise indicated, all numbers or expressions referring to quantities of ingredients, ranges, reaction conditions, etc. used herein are to be understood as modified in all instances by the term "about."

When an optical article comprises one or more surface coatings, the phrase "to deposit a coating or layer onto the optical article" means that a coating or layer is deposited onto the outermost coating of the optical article, i.e. the coating which is the closest to the air.

A coating that is "on" a side of a lens is defined as a coating that (a) is positioned over that side, (b) need not be in contact with that side, i.e., one or more intervening coatings may be disposed between that side and the coating in question (although it is preferably in contact with that side) and (c) need not cover that side completely.

The term "coating" is understood to mean any layer, layer stack or film, which may be in contact with the substrate and/or with another coating, for example a sol-gel coating or a coating made of an organic resin. A coating may be deposited or formed through various methods, including wet processing, gaseous processing, and film transfer.

The term "sheet" is understood to mean a single layer (monolayer) or a bilayer, i.e., a set of two layers in direct contact with each other. When a high refractive index sheet (having a refractive index higher than 1.55) has two layers, both layers are high refractive index layers. Similarly, when a low refractive index sheet (having a refractive index lower than or equal to 1.55) has two layers, both layers are low refractive index layers.

In the present application, a layer based on a material is defined as a layer comprising at least 80% by weight of said material, more preferably at least 90% by weight of said material, even better consisting of a layer of said material. For example, a $ZrO_2$-based layer comprises at least 80% by weight of $ZrO_2$.

The optical article prepared according to the present invention is a transparent optical article, preferably an optical lens or lens blank, and more preferably an ophthalmic lens or lens blank. The optical article may be coated on its convex main face (front side), concave main face (back/rear side), or both faces with sheets (A) to (C), the sub-layer and the multilayer interferential coating according to the invention, preferably on the convex (front) main face. As used herein, the rear face of the substrate is intended to mean the face which, when using the article, is the nearest from the wearer's eye, in the cases of ophthalmic lenses. It is generally a concave face. On the contrary, the front face of the substrate is the face which, when using the article, is the most distant from the wearer's eye. It is generally a convex face. The optical article can also be a plano article.

Herein, the term "lens" means an organic or inorganic glass lens, comprising a lens substrate, which may be coated with one or more coatings of various natures.

The term "ophthalmic lens" is used to mean a lens adapted to a spectacle frame, for example to protect the eye and/or correct the sight. Said lens can be chosen from afocal, unifocal, bifocal, trifocal and progressive lenses. Although ophthalmic optics is a preferred field of the invention, it will be understood that this invention can be applied to optical articles of other types, such as, for example, lenses for optical instruments, in photography or astronomy, optical sighting lenses, ocular visors, optics of lighting systems, etc.

In the present description, unless otherwise specified, an optical article/material is understood to be transparent when the observation of an image through said optical article is perceived with no significant loss of contrast, that is, when the formation of an image through said optical article is obtained without adversely affecting the quality of the image. This definition of the term "transparent" can be applied to all objects qualified as such in the description, unless otherwise specified.

A substrate, in the sense of the present invention, should be understood to mean an uncoated substrate, and generally has two main faces. The substrate may in particular be an optically transparent material having the shape of an optical article, for example an ophthalmic lens destined to be mounted in glasses. In this context, the term "substrate" is understood to mean the base constituent material of the optical lens and more particularly of the ophthalmic lens. This material acts as support for a stack of one or more coatings or layers.

The substrate may be made of mineral glass or organic glass, preferably organic glass. The organic glasses can be either thermoplastic materials such as polycarbonates and thermoplastic polyurethanes or thermosetting (cross-linked) materials such as diethylene glycol bis(allylcarbonate) polymers and copolymers (in particular CR-39® from PPG Industries), thermosetting polyurethanes, polythiourethanes, preferably polythiourethane resins having a refractive index of 1.60 or 1.67, polyepoxides, polyepisulfides, such as those having a refractive index of 1.74, poly(meth)acrylates and copolymers based substrates, such as substrates comprising (meth)acrylic polymers and copolymers derived from bisphenol-A, polythio(meth)acrylates, as well as copolymers thereof and blends thereof. Preferred materials for the lens substrate are polycarbonates (PC), diethylene glycol bis (allylcarbonate) polymers and substrates obtained from thermosetting polythiourethane resins, which are marketed by the Mitsui Toatsu Chemicals company as MR series, in particular MR6®, MR7® and MR8® resins. The latter substrates as well as the monomers used for their preparation are especially described in the patents U.S. Pat. Nos. 4,689, 387, 4,775,733, 5,059,673, 5,087,758 and 5,191,055.

Prior to depositing sheets (A) to (C), the sub-layer, the interferential coating or other functional coatings, the surface of the article is usually submitted to a physical or chemical surface activating and cleaning pre-treatment, so as to improve the adhesion of the layer to be deposited, such as disclosed in WO 2013/013929. This pre-treatment is generally performed on the surface of an abrasion- and/or scratch-resistant coating (hard coat).

This pre-treatment is generally carried out under vacuum. It may be a bombardment with energetic species, for example an ion beam method ("Ion Pre-Cleaning" or "IPC") or an electron beam method, a corona treatment, an ion spallation treatment, an ultraviolet treatment or a plasma treatment under vacuum, using typically an oxygen or an argon plasma. It may also be an acid or a base surface treatment and/or a solvent surface treatment (using water or an organic solvent) with or without ultrasonic treatment. Many treatments may be combined. Thanks to these cleaning treatments, the cleanliness of the substrate surface is optimized.

By energetic species, it is meant species with an energy ranging from 1 to 300 eV, preferably from 1 to 150 eV, and more preferably from 10 to 150 eV and most preferably from 40 to 150 eV. Energetic species may be chemical species such as ions, radicals, or species such as photons or electrons.

The interferential coating may be virtually any interferential coating conventionally used in the field of optics, in particular ophthalmic optics. The interference coating may be, in a non-limiting manner, an anti-reflection coating, a reflective (mirror) coating such as an infrared mirror or an ultraviolet mirror, a filter in visible spectrum such as a blue cut filter or a blue pass filter. It is preferably a filter.

An anti-reflection coating is a coating, deposited on the surface of an article, which improves the anti-reflection properties of the final article. It reduces the reflection of light at the article/air interface over a relatively broad portion of the visible spectrum. A filter is a coating, deposited on the surface of an article and configured to selectively inhibit light transmission in a narrow range of wavelengths, or configured to selectively allow light transmission in a narrow range of wavelengths.

In particular, filters inhibiting light transmission are useful for protection purposes. By selective reflection of light in a narrow range of wavelengths, potentially harmful light will not reach the eyes of a wearer. This is particularly the case for blue light in the range 420 nm-450 nm, which is believed to be harmful for retina.

Blue light known as chronobiologic blue light (in the range of 465 nm to 495 nm), linked with circadian rhythm control, may also be filtered. If excess chronobiologic blue light is emitted, for instance by screens, it might be beneficial to inhibit transmission of blue light in this range of wavelengths.

On the contrary, filters allowing light transmission are useful for sun lenses. Sun lenses usually inhibit uniformly light transmission. Filters allowing chronobiologic blue light to reach the wearer's eyes while wearing sun lenses are also desirable.

The multilayer interferential coating of the invention comprises a stack of at least one high refractive index layer having a refractive index higher than 1.55 and at least one low refractive index layer having a refractive index of 1.55 or less.

More preferably, it comprises at least two layers with a low refractive index (LI) and at least two layers with a high refractive index (HI). The total number of layers in the interferential coating is preferably higher than or equal to 3, more preferably higher than or equal to 4, and preferably lower than or equal to 8 or 7, more preferably lower than or equal to 6, even more preferably lower than or equal to 5, and most preferably equal to 5 layers.

As used herein, a layer of the interferential coating (or a layer from sheets (A), (B) or (C)) is defined as having a thickness higher than or equal to 1 nm. Thus, any layer having a thickness lower than 1 nm will not be considered when counting the number of layers in the interferential coating. The sub-layer and the layers of sheets (A) to (C) either are not considered when counting the number of layers of the interferential coating or when indicating its thickness.

HI layers and LI layers do not necessarily alternate with each other in the stack, although they also may, according to one embodiment of the invention. Two HI layers (or more) may be deposited onto each other, as well as two LI layers (or more) may be deposited onto each other.

In the present application, a layer of the interferential coating is said to be a layer with a high refractive index (HI) when its refractive index is higher than 1.55, preferably higher than or equal to 1.6, even more preferably higher than or equal to 1.8 or 1.9 and most preferably higher than or equal to 2. Said HI layers preferably have a refractive index lower than or equal to 2.2 or 2.1. A layer of an interferential coating is said to be a low refractive index layer (LI) when its refractive index is lower than or equal to 1.55, preferably lower than or equal to 1.52, more preferably lower than or equal to 1.48 or 1.47. Said LI layer preferably has a refractive index higher than or equal to 1.1.

The HI layer generally comprises one or more metal oxides such as, without limitation, zirconia ($ZrO_2$), titanium dioxide ($TiO_2$), alumina ($Al_2O_3$), tantalum pentoxide ($Ta_2O_5$), neodymium oxide ($Nd_2O_5$), praseodymium oxide ($Pr_2O_3$), praseodymium titanate ($PrTiO_3$), $La_2O_3$, $Nb_2O_5$, $Y_2O_3$, with the proviso that $TiO_2$ is not present in the outermost high refractive index layer(s) of the interferential coating. In some aspects of the invention, the outermost high refractive index layer(s) of the interferential coating do(es) not comprise titanium oxide. In a preferred embodiment, the interferential coating does not comprise any layer comprising $TiO_2$, or more generally, titanium oxide. As used herein, titanium oxide is intended to mean titanium dioxide or a substoichiometric titanium oxide (TiOx, where x<2). Titanium oxide-containing layers are indeed sensitive to photodegradation.

Optionally, the HI layers may further contain silica or other materials with a low refractive index, provided they have a refractive index higher than 1.55 as indicated hereabove. The preferred materials include $ZrO_2$, $PrTiO_3$, $Nb_2O_5$, $Ta_2O_5$, $Y_2O_3$ and mixtures thereof.

In one embodiment, all the high refractive index layers (having a refractive index higher than 1.55) of the interferential coating comprise $ZrO_2$. In another embodiment, the interferential coating comprises at least one $Ta_2O_5$-based layer.

The LI layer is also well known and may comprise, without limitation, $SiO_2$, $MgF_2$, or a mixture of silica and alumina, especially silica doped with alumina, the latter contributing to increase the interferential coating thermal resistance. The LI layer is preferably a layer comprising at least 80% by weight of silica, more preferably at least 90% by weight of silica, relative to the layer total weight, and even more preferably consists in a silica layer.

Optionally, the LI layers may further contain materials with a high refractive index, provided the refractive index of the resulting layer is lower than or equal to 1.55.

The interferential coating external layer, i.e., its layer that is the furthest from the substrate is generally a silica-based layer, comprising at least 80% by weight of silica, more preferably at least 90% by weight of silica (for example a silica layer doped with alumina), relative to the layer total weight, and even more preferably consists of a silica layer.

Generally, the HI and LI layers have a physical thickness ranging from 5 to 120 nm, preferably from 20 to 110 nm.

Generally, the total thickness of the interferential coating plus the thickness of the sub-layer plus the thickness of sheets (A) to (C) is lower than 1 μm, preferably lower than or equal to 800 nm, more preferably lower than or equal to 500 nm and even more preferably lower than or equal to 450 nm. The interferential coating total thickness is generally higher than 100 nm, preferably higher than 200 nm, and preferably lower than 1 μm or 500 nm.

Moreover, the optical article has a good resistance to heat and temperature variations, i.e., a high critical temperature. In the present patent application, the critical temperature of an article is defined as being the temperature starting from which cracks appear in a coating present at the surface of the substrate (on either main face), which results in degradation of the coating, generally the interferential coating. The critical temperature of an article coated according to the invention is preferably ≥70° C., more preferably ≥75° C., 80° C., 90° C., 100° C. or 110° C.

It is possible to define a $R_{T1}$ ratio, which is slightly different from the $R_T$ ratio defined in U.S. Pat. No. 7,692,855:

$$R_{T1} = \frac{\text{sum of the physical thicknesses of the low refractive index layers of the multilayer interferential coating}}{\text{sum of the physical thicknesses of the high refractive index layers of the multilayer interferential coating}}$$

In the present invention, only layers of the interferential coating are taken into account for the calculation of said ratio $R_{T1}$, i.e. only the layers located above the sub-layer.

In one embodiment $R_{T1}$ is higher than or equal to 0.8, preferably higher than or equal to 1, 1.3, 1.5, 1.9, 2, 2.1, 2.2 or 2.5. In one embodiment, $R_{T1}$ is lower than 5, preferably lower than at least one of the following values 4, 3.5, 3. In another embodiment, $R_{T1}$ ranges from 0.8 to 2.5. It is preferable to have a high $R_{T1}$ ratio, in order to have an article showing a higher critical temperature, while exhibiting in the same time high abrasion resistance.

In the present invention, the multilayer interferential coating is deposited onto a monolayer sub-layer having a thickness higher than or equal to 100 nm. It should be noted that such sub-layer does not belong to the interferential coating. Said sub-layer in preferably in direct contact with the interferential coating.

As used herein, an interferential coating sub-layer or adhesion layer is intended to mean a relatively thick coating, used in order to improve mechanical properties such as abrasion resistance and/or scratch resistance of the interferential coating and/or so as to reinforce its adhesion to the substrate or to the underlying coating.

The sub-layer has a thickness that is generally lower than or equal to any one of the following values: 600 nm, 500 nm, 450 nm, 400 nm, 375 nm, and that is generally higher than or equal to 110 nm, more preferably higher than or equal to 120, 130, 140, 150, 160 or 180 nm. Increasing the thickness of the sub-layer leads to an abrasion resistance improvement.

The sub-layer is preferably a $SiO_2$-based layer, this layer comprising preferably at least 80% by weight of silica, more preferably at least 90% by weight of silica, relative to the layer total weight, and even more preferably consists of a silica layer. In another embodiment, this $SiO_2$-based layer is a silica layer doped with alumina, in amounts such as defined hereabove, preferably consists of a silica layer doped with alumina.

In the present invention, the monolayer sub-layer is deposited onto a system of three sheets (A), (B) and (C), deposited in this order onto the optionally coated substrate. It should be noted that such sheets do not belong to the interferential coating. Said sub-layer is in direct contact with sheet (C). This system allows to improve abrasion resistance of the optical article without suffering from adhesion issues between the sub-layer and the underlying coating or the substrate.

Indeed, adhesion problems can be observed due to mechanical stresses when some means are implemented to improve the abrasion resistance of the optical article, such as increasing the thickness of the sub-layer and/or depositing the sub-layer under a low pressure, preferably without additional gas supply, so as to increase its compression/density.

The first high refractive index sheet (A), having a refractive index higher than 1.55, does not comprise any $Ta_2O_5$ layer and preferably does not comprise any $Ta_2O_5$-based layer. Sheet (A) may comprise one single high refractive index layer or two high refractive index layers in direct contact. The layer(s) of sheet (A) generally comprise(s) one or more metal oxides, which can be chosen from the metal oxides previously described for the high refractive index layers of the interferential coating. $Ta_2O_5$ can be present, but in an amount of preferably less than 80% by weight, more preferably less than 75%, 50%, 25%, 10%, 5%, or 1% by weight. In one embodiment, no layer of sheet (A) comprises $Ta_2O_5$.

Sheet (A) preferably comprises a $ZrO_2$-based layer, more preferably is a $ZrO_2$-based layer. In one embodiment, sheet (A) comprises a $ZrO_2$ layer, more preferably is a $ZrO_2$ layer.

Sheet (A) preferably has a thickness lower than or equal to 60 nm, more preferably lower than or equal to 50 nm, 40 nm, 30 nm, 25 nm, 20 nm or 15 nm. Sheet (A) preferably has a thickness higher than or equal to 4 nm, more preferably higher than or equal to 5 nm.

In one embodiment, sheet (A) comprises a high refractive index silicon-organic layer such as disclosed in WO 2017/021669, obtained by vacuum deposition, assisted by a source of ions, of at least one metal oxide and at least one organosilicon compound, such as octamethylcyclotetrasiloxane, decamethyltetrasiloxane, 2,4,6,8-tetramethylcyclotetrasiloxane, hexamethyldisiloxane, decamethylcyclopentasiloxane or dodecamethylpentasiloxane, said layer containing at least one metal oxide having a refractive index higher than or equal to 1.8, such as $ZrO_2$.

In one embodiment, sheet (A) comprises two high refractive index layers in direct contact and its high refractive index layer in direct contact with the optionally coated substrate is an adhesion layer. Said adhesion layer may comprise a metal or metal oxide selected from chromium; sub-stoichiometric silicon oxide SiOx with $0.5<x<1.5$, preferably $0.9<x<1.1$ so as to have a refractive index larger than 1.55; and a mixture comprising chromium, silicon and oxygen, preferably chromium and silicon oxide(s) in which silicon oxides represent from 50 to 95% by weight, preferably from 65 to 92% by weight of said layer. Examples of commercially available materials that can be used to form said adhesion layer comprising chromium, silicon and oxygen are the materials Malbunit 8/1 (mixture of $SiO_2$ and Cr) and Flexo (mixture of SiO and Cr), provided by the Umicore Materials AG company. In this embodiment, adhesion between sheet (A) and underlying optionally coated substrate is improved and delamination occurrence (adhesive failure) is decreased.

The second low refractive index sheet (B), having a refractive index of 1.55 or less, is in direct contact with sheet (A). Sheet (B) may comprise one single low refractive index layer or two low refractive index layers in direct contact. The layer(s) of sheet (B) generally comprise(s) one or more metal oxides, which can be chosen from the metal oxides previously described for the low refractive index layers of the interferential coating.

Sheet (B) preferably comprises a $SiO_2$-based layer, more preferably is a $SiO_2$-based layer. In one embodiment, sheet (B) comprises a $SiO_2$ layer, more preferably is a $SiO_2$ layer.

In one embodiment, sheet (B) comprises a low refractive index silicon-organic layer such as disclosed in WO 2017/021669, obtained by vacuum deposition, assisted by a source of ions, of at least one organosilicon compound such as octamethylcyclotetrasiloxane, decamethyltetrasiloxane, 2,4,6,8-tetramethylcyclotetrasiloxane, hexamethyldisiloxane, decamethylcyclopentasiloxane or dodecamethylpentasiloxane.

Sheet (B) preferably has a thickness lower than or equal to 80 nm, more preferably lower than or equal to 75 nm or 70 nm. Sheet (B) preferably has a thickness higher than or equal to 20 nm, more preferably higher than or equal to 25 nm, 30 nm or 35 nm. Having a sufficiently thick sheet (B) is important for obtaining an improved abrasion resistance.

The thickness of sheet (B) is preferably lower than or equal to 60 nm or 55 nm when sheet (A) is in direct contact with an uncoated substrate having a refractive index of 1.55 or more or is in direct contact with a coating (typically an abrasion and/or scratch resistant coating) having a refractive index of 1.55 or more.

In one embodiment, the deposition of the layers of sheet (B) is performed in a vacuum chamber in which no supplementary gas is supplied during said deposition, which increases its density.

The third high refractive index sheet (C), having a refractive index higher than 1.55, is in direct contact with sheet (B). Sheet (C) may comprise one single high refractive index layer or two high refractive index layers in direct contact. The layer(s) of sheet (C) generally comprise(s) one or more metal oxides, which can be chosen from the metal oxides previously described for the high refractive index layers of the interferential coating, such as $Ta_2O_5$, $Nb_2O_5$, $PrTiO_3$, $ZrO_2$ and $Y_2O_3$.

In one embodiment, sheet (C) does not comprise any $Ta_2O_5$ layer, preferably any $Ta_2O_5$-based layer. In another embodiment, $Ta_2O_5$ is present in a layer of sheet (C) in an amount of less than 80% by weight, preferably less than 75%, 50%, 25%, 10%, 5%, or 1% by weight. In one embodiment, no layer of sheet (C) comprises $Ta_2O_5$.

Sheet (C) preferably comprises a $ZrO_2$-based layer, more preferably is a $ZrO_2$-based layer. In one embodiment, sheet (C) comprises a $ZrO_2$ layer, more preferably is a $ZrO_2$ layer.

Sheet (C) preferably has a thickness lower than or equal to 60 nm, more preferably lower than or equal to 50 nm, 40 nm, 30 nm, 25 nm, 20 nm or 15 nm. In one embodiment, these thickness requirements are simultaneously satisfied by sheets (A) and (C). Sheet (A) preferably has a thickness higher than or equal to 4 nm, more preferably higher than or equal to 5 nm, 7 nm or 10 nm.

In one embodiment, sheet (C) comprises a high refractive index silicon-organic layer such as disclosed in WO 2017/021669, obtained by vacuum deposition, assisted by a source of ions, of at least one metal oxide and at least one organosilicon compound, such as octamethylcyclotetrasiloxane, decamethyltetrasiloxane, 2,4,6,8-tetramethylcyclotetrasiloxane, hexamethyldisiloxane, decamethylcyclopentasiloxane or dodecamethylpentasiloxane, said layer containing at least one metal oxide having a refractive index higher than or equal to 1.8, such as $ZrO_2$.

The total thickness of sheets (A), (B) and (C) preferably ranges from 40 to 100 nm, more preferably from 45 to 95 nm or from 50 to 90 nm.

The refractive indexes of sheets (A) and (C) can be independently chosen from the refractive indexes previously described for the high refractive index layers of the interferential coating. The refractive index of sheet (B) can be chosen from the refractive indexes previously described for the low refractive index layers of the interferential coating.

The total number of layers of the system of sheets (A) to (C) ranges from 3 to 6, more preferably from 3 to 4 or 5, and is ideally equal to three. In other words, sheets (A) and/or (B) and/or (C) are preferably monolayers. This system preferably comprises, in the direction moving away from the substrate, a $ZrO_2$-based layer, a $SiO_2$-based layer, and a $ZrO_2$-based layer, more preferably consists of a $ZrO_2$-based layer, a $SiO_2$-based layer, and a $ZrO_2$-based layer. This system preferably comprises, in the direction moving away from the substrate, a $ZrO_2$ layer, a $SiO_2$ layer, and a $ZrO_2$ layer, more preferably consists of a $ZrO_2$ layer, a $SiO_2$ layer, and a $ZrO_2$ layer.

Optionally, the exposed surface of the sub-layer may be submitted, prior to depositing the first layer of the interferential coating, to a physical or a chemical activation treatment which may be selected from the pre-treatments the substrate may undergo prior to depositing the sub-layer and which have already been mentioned hereabove. The preferred pre-treatment is an ion bombardment, for example by using an ion gun-generated argon ion beam. Such physical or chemical activation treatments (preferably an ionic bombardment treatment) may also be performed on the exposed surface of one or more layer(s) of the multilayer interference coating, prior to depositing the subsequent layer of said multilayer interferential coating.

The optical article of the invention may be made antistatic, that is to say not to retain and/or develop a substantial static charge, by incorporating at least one electrically conductive layer into the stack present on the surface of the article, preferably in the interferential coating.

The ability for a lens to evacuate a static charge obtained after rubbing with a piece of cloth or using any other procedure to generate a static charge (charge applied by . . . ) may be quantified by measuring the time it takes for said charge to dissipate. Thus, antistatic lenses have a discharge time of about a few hundred milliseconds, preferably 500 ms or less, whereas it is of about several tens of seconds for a static lens. In the present application, discharge times are measured according to the method exposed in the French application FR 2943798.

As used herein, an "electrically conductive layer" or an "antistatic layer" is intended to mean a layer which, due to its presence on the surface of a substrate, decreases the ability of the optical article to attract dust/particles due to charge accumulation. Preferably, when applied onto a non-antistatic substrate (i.e. having a discharge time higher than 500 ms), the antistatic layer enables the optical article not to retain and/or develop a substantial static charge, for example to have a discharge time of 500 ms or less after a static charge has been applied onto the surface thereof, so that small dust is prevented from adhering to the optical article due to prevention of static effects.

The electrically conductive layer may be located at various places in the stack, generally in or in contact with the interferential coating, provided that the reflective or anti-reflective properties thereof are not affected. It is preferably located between two layers of the interferential coating, and/or is preferably adjacent to a layer with a high refractive index of such interferential coating. In an embodiment, the electrically conductive layer is located immediately under a layer with a low refractive index of the interferential coating, most preferably is the penultimate layer of the interferential coating by being located immediately under the LI external layer of the interferential coating.

In one embodiment, the electrically conductive layer is in direct contact with two layers having a refractive index of 1.55 or less, and said electrically conductive layer is preferably located in penultimate position of the interferential coating in the direction moving away from the substrate.

The electrically conductive layer should be thin enough not to alter the transparency of the interferential coating. The electrically conductive layer is preferably made from an electrically conductive and highly transparent material, generally an optionally doped metal oxide. In this case, the thickness thereof preferably ranges from 1 to 15 nm, more preferably from 1 to 10 nm, ideally from 2 to 8 nm.

Preferably, the electrically conductive layer comprises an optionally doped metal oxide, selected from indium, tin, zinc oxides and mixtures thereof. Tin-indium oxide ($In_2O_3$: Sn, tin-doped indium oxide), aluminum-doped zinc oxide (ZnO:Al), indium oxide ($In_2O_3$) and tin oxide ($SnO_2$) are preferred. In a most preferred embodiment, the electrically conductive and optically transparent layer is a tin-indium oxide layer, noted ITO layer or a tin oxide layer.

Generally, the electrically conductive layer contributes, within the stack, but in a limited manner because of its low thickness, to obtaining interferential properties and typically represents a layer with a high refractive index in said coating. This is the case for those layers made from an electrically conductive and highly transparent material such as ITO or $SnO_2$ layers. Accordingly, when it is present, the electrically conductive layer is preferably the outermost high refractive index layer of the interferential coating, or one of the outermost high refractive index layers of the interferential coating when it is adjacent to one or more high refractive index layers.

The electrically conductive layer may be deposited according to any suitable method, for example by vacuum evaporation deposition, preferably ion-beam-assisted (IAD, described below) to increase its transparence, or by means of cathode sputtering.

The electrically conductive layer may also be a very thin layer of a noble metal (Ag, Au, Pt, etc.) typically smaller than 1 nm in thickness and preferably less than 0.5 nm in thickness.

The various layers of the interferential coating, the sub-layer, and sheets (A) to (C) are preferably deposited by vapor phase deposition, under vacuum, according to any of the following methods: i) by evaporation, optionally under ion beam assistance; ii) by ion-beam spraying; iii) by cathode sputtering; iv) by plasma-assisted chemical vapor deposition. These various methods are described in the following references "Thin Film Processes" and "Thin Film Processes II," Vossen & Kern, Ed., Academic Press, 1978 and 1991, respectively. A particularly recommended method is evaporation under vacuum. Preferably, the deposition of each of the above-mentioned layers is conducted by evaporation under vacuum. Such a process does advantageously avoid heating the substrate, which is particularly interesting for coating heat-sensitive substrates such as organic glasses.

A treatment step with energetic species such as previously defined may also be carried out, simultaneously whilst depositing one or more of the various layers of the interference coating, sub-layer, or sheets (A) to (C). In particular, working under ion assistance enables to pack said layers while they are being formed, and increases their compression and refractive index. The use of ion assistance during the deposition of a layer produces a layer that is structurally different from a layer deposited without ion assistance.

The ion assisted deposition method or IAD is notably described in US patent application 2006/017011 and in U.S. Pat. No. 5,268,781. Vapor phase deposition under ion assistance comprises depositing onto a substrate a layer of material by simultaneously bombarding by means of an ion beam said layer while it is being formed, and preferably under ion bombardment achieved by means of an ion gun. The ion bombardment leads to an atomic rearrangement in the coating being formed, which increases its density. The IAD not only allows an improvement of the deposited layer adhesion, but also an increase in their refractive index. The IAD operation may be performed by means of an ion gun, where ions are particles composed of gas atoms from which one or more electron(s) is or are extracted. It does preferably consist of bombarding the surface to be treated with oxygen ions. Other ionized gases may be used, either combined with oxygen, or not, for example argon, nitrogen, in particular a mixture of $O_2$ and argon according to a volume ratio ranging from 2:1 to 1:2.

The outermost low refractive index layer(s) of the interferential coating is (are) preferably deposited without ionic assistance, preferably without concomitant treatment with energetic species. In another embodiment, the low refractive index layers of the interferential coating and/or the sub-layer are (is) deposited without ionic assistance, preferably without concomitant treatment with energetic species.

In one embodiment, no layer of the interferential coating is deposited under ion assistance (preferably no layer of the interferential coating is deposited under concomitant treatment with energetic species), except the electrically conductive layer(s), if present in the interferential coating.

In another embodiment, at least one HI layer of the interferential coating is deposited under ion assistance, such as an electrically conductive layer or a $Ta_2O_5$ layer, if present in the interferential coating.

Optionally, the deposition of one or more of the layers is performed by supplying (a supplementary) gas during the deposition step of the layer in a vacuum chamber, such as disclosed in US 2008/206470. Concretely, an additional gas such as a rare gas, for example argon, krypton, xenon, neon; a gas such as oxygen, nitrogen, or mixtures of two gases or more amongst these, is or are introduced into the vacuum deposition chamber while the layer is being deposited. The gas employed during this deposition step is not an ionized gas, more preferably not an activated gas.

This gas supply makes it possible to regulate the pressure and differs from an ionic bombardment treatment, such as ion assistance. It generally enables the limitation of stress in the interferential coating and to reinforce the adhesion of the layers. When such deposition method is used, which is called deposition under gas pressure regulation, it is preferred to work under an oxygen atmosphere (so called "passive oxygen"). The use of an additional gas supply during the deposition of a layer produces a layer that is structurally different from a layer deposited without additional gas supply.

In an embodiment of the invention, the deposition of the sub-layer is performed in a vacuum chamber under a pressure lower than $1.6 \times 10^{-4}$ mBar, preferably lower than $10^{-4}$ mBar, more preferably lower than $8.10^{-5}$ mBar.

In a preferred embodiment of the invention, the deposition of the sub-layer is performed in a vacuum chamber in which no supplementary gas is supplied during said deposition. It has been found that depositing the sub-layer under a low pressure, and ideally without gas supply to obtain a still lower pressure, leads to a sub-layer with a lower porosity, a higher compression and density, and an increase of the abrasion resistance of the optical article.

In another embodiment, the outermost high refractive index layer(s) of the interferential coating, except the electrically conductive layers, if present in outermost position, is (are) deposited in a vacuum chamber in which at least one supplementary gas is supplied during said deposition. In another embodiment, the high refractive index layer(s) of the interferential coating, except the electrically conductive layer(s), if present in outermost position, is (are) deposited in a vacuum chamber in which at least one supplementary gas is supplied during said deposition.

According to a particularly preferred embodiment, the optical article comprises, starting from the surface of the substrate optionally coated with one or more functional coatings such as a primer coating and/or a hard coat, a high refractive index layer (which is not a $Ta_2O_5$ layer) having a thickness ranging from 3 to 25 nm, more preferably from 4 to 20 nm, preferably of zirconia (sheet (A)), a low refractive index layer having a thickness ranging from 25 to 75 nm, preferably from 30 to 70 nm, preferably of silica (sheet (B)), a high refractive index layer having a thickness ranging from 5 to 25 nm, preferably from 6 to 20 nm, preferably of zirconia (sheet (C)), a sub-layer having a thickness of from 100 to 300 nm, more preferably from 110 to 250 nm, even more preferably from 120 to 225 nm, preferably a silica-based sub-layer, and an interferential coating, preferably an anti-reflective coating, containing in the following order, a high refractive index with a thickness of from 6 to 45 nm, preferably of from 8 to 40 nm, preferably of zirconia or $Ta_2O_5$, a layer with a low refractive index with a thickness of from 15 to 50 nm, preferably of from 18 to 45 nm, preferably of silica, a layer with a high refractive index with a thickness of from 20 to 100 nm, preferably of from 25 to 95 nm, preferably of zirconia or $Ta_2O_5$, optionally a layer with a low refractive index with a thickness of from 5 to 20 nm, preferably of from 8 to 15 nm, preferably of silica, optionally an electrically conductive layer with a thickness of from 3 to 15 nm, preferably of from 4 to 8 nm, preferably made of tin oxide or ITO, and a layer with a low refractive index with a thickness of from 60 to 150 nm, preferably of from 65 to 140 nm, preferably of silica.

The interferential coating/sub-layer/sheets (A) to (C) system may be deposited directly onto a bare substrate. In some applications, it is preferred that the main surface of the substrate be coated with one or more functional coatings improving its optical and/or mechanical properties, prior to depositing the interferential coating of the invention. These functional coatings traditionally used in optics may be, without limitation, an impact-resistant primer layer, an abrasion- and/or scratch-resistant coating (hard coat), a polarized coating, an antistatic coating, a photochromic coating, a tinted coating or a stack made of two or more of such coatings.

The impact-resistant primer coating which may be used in the present invention can be any coating typically used for improving impact resistance of a finished optical article. By definition, an impact-resistant primer coating is a coating which improves the impact resistance of the finished optical article as compared with the same optical article but without the impact-resistant primer coating.

Typical impact-resistant primer coatings are (meth)acrylic based coatings and polyurethane based coatings. In particular, the impact-resistant primer coating according to the invention can be made from a latex composition such as a poly(meth)acrylic latex, a polyurethane latex or a polyester latex.

Preferred primer compositions include compositions based on thermoplastic polyurethanes, such as those described in the patents JP 63-141001 and JP 63-87223, poly(meth)acrylic primer compositions, such as those described in the patents U.S. Pat. Nos. 5,015,523 and 6,503,631, compositions based on thermosetting polyurethanes, such as those described in the patent EP 0404111 and compositions based on poly(meth)acrylic latexes or polyurethane latexes, such as those described in the patents U.S. Pat. No. 5,316,791 and EP 0680492. Preferred primer compositions are compositions based on polyurethanes and compositions based on latexes, in particular polyurethane latexes, poly(meth)acrylic latexes and polyester latexes, as well as their combinations. In one embodiment, the impact-resistant primer comprises colloidal fillers.

Poly(meth)acrylic latexes are latexes based on copolymers essentially made of a (meth)acrylate, such as for example ethyl (meth)acrylate, butyl (meth)acrylate, methoxyethyl (meth)acrylate or ethoxyethyl (meth)acrylate, with at least one other co-monomer in a typically lower amount, such as for example styrene.

Commercially available primer compositions suitable for use in the invention include the Witcobond® 232, Witcobond® 234, Witcobond® 240, Witcobond® 242 compositions (marketed by BAXENDEN CHEMICALS), Neorez® R-962, Neorez® R-972, Neorez® R-986 and Neorez® R-9603 (marketed by ZENECA RESINS), and Neocryl® A-639 (marketed by DSM coating resins).

The thickness of the impact-resistant primer coating, after curing, typically ranges from 0.05 to 30 µm, preferably 0.2 to 20 µm and more particularly from 0.5 to 10 µm, and even better 0.6 to 5 µm or 0.6 to 3 µm, and most preferably 0.8 to 1.5 µm.

The impact-resistant primer coating is preferably in direct contact with an abrasion- and/or scratch-resistant coating. In one embodiment, its refractive index ranges from 1.45 to 1.55. In another embodiment, its refractive index is higher than or equal to 1.55.

The abrasion- and/or scratch-resistant coating may be any layer traditionally used as an anti-abrasion and/or anti-scratch coating in the field of optical lenses.

The abrasion- and/or scratch-resistant coatings are preferably hard coatings based on poly(meth)acrylates or silanes, generally comprising one or more mineral fillers intended to increase the hardness and/or the refractive index of the coating once cured.

Abrasion- and/or scratch-resistant coatings are preferably prepared from compositions comprising at least one alkoxysilane and/or a hydrolyzate thereof, obtained for example through hydrolysis with a hydrochloric acid solution and optionally condensation and/or curing catalysts.

Suitable coatings that are recommended for the present invention include coatings based on epoxysilane hydrolyzates such as those described in the patents EP 0614957, U.S. Pat. Nos. 4,211,823 and 5,015,523.

A preferred abrasion- and/or scratch-resistant coating composition is the one disclosed in the patent EP 0614957, in the name of the applicant. It comprises a hydrolyzate of epoxy trialkoxysilane and dialkyl dialkoxysilane, colloidal silica and a catalytic amount of an aluminum-based curing catalyst such as aluminum acetylacetonate, the rest being essentially composed of solvents traditionally used for formulating such compositions. Preferably, the hydrolyzate used is a hydrolyzate of γ-glycidoxypropyltrimethoxysilane (GLYMO) and dimethyldiethoxysilane (DMDES).

The abrasion- and/or scratch-resistant coating composition may be deposited by known methods and is then cured, preferably using heat or ultraviolet radiation. The thickness of the (cured) abrasion- and/or scratch-resistant coating does generally vary from 2 to 10 µm, preferably from 3 to 5 µm.

The optical article according to the invention may also comprise coatings formed on the interferential coating and capable of modifying the surface properties thereof, such as a hydrophobic and/or oleophobic coating (antifouling top coat). These coatings are preferably deposited onto the outer layer of the interferential coating. Generally, their thickness is lower than or equal to 10 nm, does preferably range from 1 to 10 nm, more preferably from 1 to 5 nm. Antifouling top coats are generally coatings of the fluorosilane or fluorosilazane type, preferably comprising fluoropolyether moieties and more preferably perfluoropolyether moieties. More detailed information on these coatings is disclosed in WO 2012076714.

Instead of a hydrophobic coating, a hydrophilic coating may be used which provides anti-fog properties (anti-fog coating), or a precursor of an anti-fog coating which provides anti-fog properties when associated with a surfactant. Examples of such anti-fog precursor coatings are described in the patent application WO 2011/080472.

The additional coatings such as primers, hard coats and antifouling top coats may be deposited onto a main face of the substrate using methods known in the art, including spin-coating, dip-coating, spray-coating, evaporation, sputtering, chemical vapor deposition and lamination.

Typically, an optical article according to the invention comprises a substrate that is successively coated with an impact-resistant primer layer, an anti-abrasion and/or scratch-resistant layer, sheets (A) to (C), a sub-layer and an interferential coating according to the invention, and a hydrophobic and/or oleophobic coating, or a hydrophilic coating which provides anti-fog properties, or an anti-fog precursor coating.

Due to the presence of sheets (A) to (C), the sub-layer and interferential coating according to the invention (as an example an antireflective coating), the optical articles of the invention exhibit a high value of abrasion resistance measured according to the Bayer ASTM (Bayer sand) operating protocol described hereafter, i.e., in accordance with the ASTM F735-81 standard. For Bayer ASTM measurement, coated face has to be convex. In examples, when a coating is deposited on a concave face, the Bayer ASTM value is the measurement made on the same coating (Sheets (A) to (C), sub-layer and interferential coating) but deposited on a convex face.

According to the present invention, the optical article, the main face of which, preferably the front face, is covered by the interferential stack of the invention, exhibits a Bayer value measured in accordance with the ASTM F735-81 standard (sand Bayer value) higher than 5.5, preferably higher than any one of the following value: 6, 6.5, 7, 7.5, 8, 9, 10, 11. Thus, the present invention provides optical articles with a high abrasion resistance, since typical sand Bayer values for optical articles are around 5. Such values can be obtained by controlling the thickness of the sub-layer and sheets (A) to (C), in particular sheet (B), the $R_{T1}$ ratio, and/or the deposition parameters, in particular the pressure during the deposition of the sub-layer.

In one embodiment, the optical article is a lens and the interferential coating, sheets (A) to (C) and the sub-layer are applied on the front main face of the lens and/or the rear main face of the lens, preferably the front main face of the lens.

In another embodiment, the optical article is a lens and the interferential coating, sheets (A) to (C) and the sub-layer are applied on the front main face of the lens (or the back main face), and the back main face of the lens (or the front main face) is coated with an interferential coating, which is identical to or different from the interferential coating of the other face, optionally with a sub-layer, which is identical to or different from the sub-layer of the other face, optionally with sheets (A) to (C), which are identical to or different from sheets (A) to (C) of the other face, and optionally with an impact resistant primer coating and/or an abrasion- and/or scratch-resistant coating, which are identical to or different from those of the other face. Obviously, the layers of the back face are stacked in an order that is similar to the front face.

The optical lens according to the invention comprises on at least one main face of the substrate a multilayer interferential coating which selectively reflects or transmits visible light (380-780 nm) in a range of wavelengths having a FWHM lower than 150 nm, preferably lower than 120 nm.

The maximum reflection or transmission of a filter defines the center of the band filter. The Full Width at Half Maximum (FWHM) is a well known measure of bandwidth for filters.

According to the invention, a selective reflection or transmission corresponds to a maximum of reflection or transmission of the filter locally higher than 5%, preferably higher than 10%, as compared to a reflection or transmission varying monotonously over the bandwidth of the filter (a baseline).

As used herein, having a reflection or transmission peak in a range of wavelengths means that the maximum of the peak falls within this range, said reflection or transmission being measured by obtaining a reflection or transmission spectrum (reflection or transmission as a function of wavelength) of the interferential coating.

In one embodiment, the multilayer interferential coating, the sub-layer and sheets (A) to (C) are coated on one main face of the lens, and the other main face of the lens is coated with the interferential coating that selectively reflects or transmits visible light in a range of wavelengths, i.e., the filtering interferential coating.

In another embodiment, the multilayer interferential coating, the sub-layer and sheets (A) to (C) are coated on one main face of the lens, and said multilayer interferential coating selectively reflects or transmits visible light in a range of wavelengths as described above. In other words, said multilayer interferential coating and said filtering interferential coating that selectively reflects or transmits visible light in a range of wavelengths are the same coating.

Besides, it is advisable for a spectacle wearer to wear before each of both eyes an ophthalmic lens that strongly reduces reflection on the rear face in the UVA- and UVB-radiation ranges, which are particularly harmful to the retina. Such lenses may also provide increased visual performance due to increased contrast sensitivity.

Reflecting UV light is not really problematic on the front face of the lens, since the major part of the UV radiation which comes from the front of the wearer and might attain the wearer's eye (normal incidence, 0 to 15°) generally gets absorbed by the ophthalmic lens substrate. On the other hand, the UV radiation resulting from light sources located behind the wearer may reflect on the lens rear face and reach the wearer's eye if the lens is not provided with an antireflective coating which is efficient in the ultraviolet region, thus potentially affecting the wearer's health. It is observed that the light rays that may reflect onto the lens rear face and reach the wearer's eye have a narrow incidence angle range, ranging from 30 to 45° (oblique incidence).

In this regard, the mean reflection factor $R_{UV}$ on the rear (back) main face of the substrate between 280 nm and 380 nm, weighted by the function $W(\lambda)$ defined in the ISO 13666:1998 standard, is preferably lower than 10% or 5%, preferably lower than 4.5%, more preferably lower than or equal to 4%, even better lower than or equal to 3%, at an angle of incidence of 35°. These performances can be obtained through the use of an antireflection coating deposited onto the rear main face of the lens.

The mean reflection factor $R_{UV}$ on the front main face of the substrate between 280 nm and 380 nm, weighted by the function $W(\lambda)$ defined in the ISO 13666:1998 standard, is preferably higher than 5%, preferably higher than 10%, at an angle of incidence of 15°.

Said mean reflection factor $R_{UV}$ is defined through the following relation:

$$R_{UV} = \frac{\int_{280}^{380} W(\lambda).R(\lambda).d\lambda}{\int_{280}^{380} W(\lambda).d\lambda}$$

wherein $R(\lambda)$ represents the lens spectral reflection factor at a given wavelength, and $W(\lambda)$ represents a weighting function equal to the product of the solar spectrum irradiance $Es(\lambda)$ and the efficiency relative spectral function $S(\lambda)$.

The spectral function $W(\lambda)$, enabling to calculate the ultraviolet radiation transmission factors, is defined according to the ISO 13666:1998 standard. It makes it possible to express the ultraviolet solar radiation distribution tempered by the relative spectral efficiency of such radiation for a user, since it simultaneously takes both the solar spectral energy $Es(\lambda)$ into account, which does globally emit less UVB-rays as compared to UVA-rays, and the spectral efficiency $S(\lambda)$, UVB-rays being more harmful than UVA-rays. The values for those three functions in the ultraviolet region are given in the table disclosed in ISO 13666:1998 standard (which is reproduced at page 6 of the publication WO 2012/076714).

$R_{UV}$ is measured in the present application at an angle of incidence of 35° for the back main face and at an angle of incidence of 15° for the front main face. Calculation examples of $R_{UV}$ for angles of incidence at 30° and 45° are given in WO 2012/076714. A person skilled in the art can easily implement calculation based on reflection values measured on the respective faces at the desired incidence angle (15°, 35°).

In all embodiment of the invention, the mean reflection factor $R_{UV}$ on the rear (back) main face of the substrate between 280 nm and 380 nm, weighted by the function $W(\lambda)$ defined in the ISO 13666:1998 standard, is preferably lower than 10%.

In an embodiment, the filtering interferential coating shows a reflection band in the UV-violet range of light, so as to reflect and thus inhibit transmission of high energy visible light and near UV light, and in particular harmful blue light in the range 420 nm-450 nm.

The mean reflection factor RmB1 of blue light (420 nm-450 nm) is defined by the formula:

$$R_{mB1} = \frac{\int_{420}^{450} R(\lambda)d\lambda}{450 - 420}$$

wherein $R(\lambda)$ represents the reflection factor at wavelength $\lambda$. RmB1 can be measured for any angle of incidence, based on $R(\lambda)$ measured at the same angle of incidence.

The mean reflection factor RmB1 is preferably larger than 15%, more preferably larger than 20%, even more preferably larger than 30%, at an angle of incidence lower than 35°.

In an embodiment, the optical lens according to the invention is coated on one main face (front main or rear main face) with a coating having a selective reflection with RmB1 preferably larger than 15%, more preferably larger than 20%, even more preferably larger than 30%, at an angle of incidence lower than 35°. In this embodiment, it is preferred to coat the front main face of the lens, so as to avoid multiple reflections of light arriving on the lens and to have an interferential coating on the rear main face of the lens with a mean reflection factor $R_{UV}$ between 280 nm and 380 nm, weighted by the function $W(\lambda)$ defined in the ISO 13666:1998 standard lower than 10%.

In an embodiment, the optical lens according to the invention is coated on both faces (front and rear main faces) with interferential coatings having a selective reflection. Coatings may be identical or different.

In another embodiment, the filtering interferential coating shows a reflection band in the blue range of light, so as to reflect blue light known as chronobiologic blue light in the range 465 nm-495 nm. Such inhibition is desirable for people exposed to blue light during night, so as not to disturb their circadian rhythm.

The mean reflection factor RmB2 of blue light (465 nm-495 nm) is defined by the formula:

$$R_{mB2} = \frac{\int_{465}^{495} R(\lambda)d\lambda}{495 - 465}$$

wherein $R(\lambda)$ represents the reflection factor at wavelength $\lambda$. RmB2 can be measured for any angle of incidence, based on $R(\lambda)$ measured at the same angle of incidence.

The mean reflection factor RmB2 is preferably larger than 10%, more preferably larger than 15%, even more preferably larger than 20%, at an angle of incidence lower than 35°.

In an embodiment, the optical lens according to the invention is coated on one main face (front main or rear main face) with a coating having a selective reflection RmB2 preferably larger than 10%, more preferably larger than 15%, even more preferably larger than 20%, at an angle of incidence lower than 35°. In this embodiment, it is preferred to coat the front main face of the lens, so as to avoid multiple reflections of light arriving on the lens and to have an interferential coating on the rear main face of the lens with a mean reflection factor $R_{UV}$ between 280 nm and 380 nm, weighted by the function $W(\lambda)$ defined in the ISO 13666:1998 standard lower than 10%.

In an embodiment, the optical lens according to the invention is coated on both faces (front and rear main faces) with interferential coatings having a selective reflection. Coatings may be identical or different.

In another embodiment, the filtering interferential coating shows a transmission band in the blue range of light, so as to allow blue light known as chronobiologic blue light in the range 465 nm-495 nm to reach the eyes of the wearer. Such transmission is desirable for people wearing sun lenses, so that they receive a sufficient amount of chronobiologic blue light and not to disturb their circadian rhythm.

In this embodiment, the mean reflection factor RmB2 is preferably lower than 10%, more preferably lower than 5%, even more preferably larger than 2%, at an angle of incidence lower than 35°. In this embodiment, the luminous transmittance Tv, which is defined in ISO 13666:1998 standard as the ratio of the luminous flux transmitted by a lens to the incident luminous flux is preferably lower than 43% (corresponding to class 2 sun lenses), more preferably lower than 18% (corresponding to class 3 sun lenses).

The "mean light reflection factor," noted $R_v$, also called "luminous reflection", is such as defined in the ISO 13666:1998 standard, and measured in accordance with the ISO 8980-4 standard (for an angle of incidence lower than 17°, typically of 15°), i.e. this is the weighted spectral reflection average over the whole visible spectrum between 380 and 780 nm.

The mean light reflection factor $R_v$ of the face of the lens coated by an anti-reflection coating according to the invention is preferably lower than or equal to 2.5% (per face), preferably lower than or equal to 2%, more preferably lower than or equal to 1%, even more preferably ≤0.85%, per face of the article.

In each of these embodiments, the total number of layers in the interferential coating, preferably an antireflection coating, is preferably higher than or equal to 3, preferably lower than or equal to 5, and/or the total thickness of the interferential coating (preferably an antireflective coating) plus the thickness of the sub-layer plus the thickness of sheets (A) to (C) is preferably lower than 1 micrometer, more preferably lower than or equal to 800 nm or 500 nm.

The colorimetric coefficients C* and h of the optical article of the invention in the international colorimetric CIE L*a*b* are calculated between 380 and 780 nm, taking the standard illuminant D65 and the observer into account (angle of incidence: 15°). The observer is a "standard observer" (10°) as defined in the international colorimetric system CIE L*a*b*.

It is possible to prepare interferential coatings without limitation as regards their hue angle (h), which relates to the residual color displayed by said interferential coating (color of the reflected light), and preferably ranges from 40° to 300°, more preferably from 50° to 290°. In some embodiments, the optical article has a hue angle (h) ranging from 240° to 300°, preferably from 250° to 290°, more preferably from 260° to 280°, thus resulting in a perceived residual reflected color blue to violet, preferably close to violet. In another embodiment, the optical article has a hue angle (h) higher than or equal to 135°, more preferably higher than or equal to 140° and better ranging from 140° to 160°, thus resulting in an interferential coating having a green reflection. In another embodiment, the optical article has a hue angle (h) ranging from 40° to 90°, preferably 50° to 90°, better 50° to 70°, thus resulting in an interferential coating having a gold reflection.

In some aspects of the invention, the interferential coating has a chroma (C*) that is lower than 15 (for an angle of incidence of 15°), more preferably lower than 13. Obtaining low residual color intensity (chroma) articles is preferable with respect to wearer's comfort viewpoint, in the cases of ophthalmic lenses.

The invention further relates to a method of manufacturing an optical article such as described hereabove, comprising:

providing an optical lens comprising a substrate having a front main face and a rear main face, depositing onto at least one main face of the substrate, in this order, a first high refractive index sheet (A) having a refractive index higher than 1.55, which does not comprise any $Ta_2O_5$ layer, a second low refractive index sheet (B) having a refractive index of 1.55 or less so that it is in direct contact with the former sheet (A), a third high refractive index sheet (C) having a refractive index higher than 1.55 so that it is in direct contact with the former sheet (B), a monolayer sub-layer having an exposed surface and a thickness higher than or equal to 100 nm so that it is in direct contact with the former sheet (C), and a multilayer interferential coating comprising a stack of at least one high refractive index layer having a refractive index higher than 1.55 and at least one low refractive index layer having a refractive index of 1.55 or less, thereby obtaining a coated optical article, wherein at least one main face of the substrate is coated with a filtering interferential coating that selectively reflects visible light in a range of wavelengths, and the reflection spectrum of said filtering interferential coating has a reflection peak centered at a wavelength chosen within said range of wavelengths that exhibits a full width at half maximum lower than 150 nm, preferably lower than 120 nm, or at least one main face of the substrate is coated with a filtering interferential coating that selectively transmits visible light in a range of wavelengths, and the transmission spectrum of said filtering interferential coating has a transmission peak centered at a wavelength chosen within said range of wavelengths that exhibits a full width at half maximum lower than 150 nm, preferably lower than 120 nm.

In preferred embodiments, the exposed surface of the sub-layer has been submitted to an ionic bombardment treatment prior to depositing said multilayer interferential coating, and/or the deposition of the sub-layer is conducted in a vacuum chamber in which no supplementary gas is supplied during said deposition.

In another embodiment, the exposed surface of at least one layer of the multilayer interferential coating has been submitted to an ionic bombardment treatment prior to depositing the subsequent layer of said multilayer interferential coating.

In another embodiment, the exposed surface of each layer of the multilayer interferential coating except the layer of said coating that is the furthest from the substrate has been submitted to an ionic bombardment treatment prior to depositing the subsequent layer of said multilayer interferential coating. This embodiment involving multiple interlayer bombardments is preferably implemented when the sub-layer is deposited under a low pressure ($<1.6\times10^{-4}$ mBar or even better in a vacuum chamber without supplying any additional gas during the deposition) to get a better adhesion of the layers within the interferential stack.

The exposed surface of sheet (C) is preferably submitted to an ionic bombardment treatment prior to depositing the subsequent layer, which is the sub-layer.

In another embodiment, the exposed surface of the following layers is submitted to an ionic bombardment treatment prior to depositing the subsequent layer onto said layers: sheet (C), the sub-layer and each layer of the multilayer interferential coating except the outermost layer of said coating.

In one embodiment, the present optical article is prepared by forming on the substrate a primer coating and/or an abrasion- and/or scratch-resistant coating in a first manufacturing site, while the other coatings are formed in a second manufacturing site.

The following examples illustrate the present invention in a more detailed, but non-limiting manner. Unless stated otherwise, all thicknesses disclosed in the present application relate to physical thicknesses. The percentages given in the tables are weight percentages. Unless otherwise specified, the refractive indexes referred to in the present invention are expressed at 20-25° C. for a wavelength of 550 nm.

EXAMPLES

1. General Procedures

The articles employed in the examples comprise a 65 mm-diameter polythiourethane MR8® lens substrate (from Mitsui Toatsu Chemicals Inc., refractive index=1.59), with a power of −2.00 diopters and a thickness of 1.2 mm, coated on its convex main face with the impact resistant primer coating disclosed in the experimental part of WO 2010/109154 modified to have a refractive index of 1.6 by addition of high refractive index colloids, and the abrasion- and scratch-resistant coating (hard coat) disclosed in example 3 of EP 0614957 (modified to have a refractive index of 1.6 rather than 1.5 by adding high refractive index colloids), sheets (A), (B) and (C), a sub-layer, an antireflection coating, and the antifouling coating disclosed in the experimental section of patent application WO 2010/109154, i.e., by evaporation under vacuum of the Optool DSX® compound marketed by Daikin Industries (thickness: from 2 to 5 nm).

The concave main face of the substrate was coated with the same impact resistant primer coating and abrasion- and scratch-resistant coating (hard coat), and with an antireflection coating such that the concave main face exhibits a $R_{UV}$ value at an angle of incidence of 35° lower than 10%.

The various layers such as the sub-layers, sheets (A), (B) and (C) and the layers of the antireflection coating were deposited without heating the substrates, by vacuum evaporation, optionally assisted (IAD) during the deposition by a beam of oxygen and possibly argon ions, when specified (evaporation source: electron gun), and optionally under pressure regulation by supplying (passive) $O_2$ gas into the chamber, where indicated.

The vacuum evaporation device that made it possible to deposit the various antireflective layers was a vacuum coater BAK from Physimeca having two systems for evaporating materials, an electron gun evaporation system, a thermal evaporator (Joule-effect evaporation system), and a Mark 2+ ion gun from Veeco for use in the preliminary phase of preparation of the surface of the substrate by argon ion bombardment (IPC) and in the ion-assisted deposition (IAD) of the layers.

2. Preparation of the Optical Articles

The lenses were placed on a carrousel provided with circular openings intended to accommodate the lenses to be treated, the concave side facing the evaporation sources and the ion gun.

The method for producing optical articles comprises introducing the lens substrate provided with the primer and abrasion-resistant coatings into a vacuum deposition chamber, conducting a pumping step until a high vacuum was created, followed by an ion gun conditioning step (IGC, such as disclosed in FR 2957454, $3.5\times10^{-5}$ mBar as starting pressure, 140 V, 3.5 A, argon, 60 seconds), a substrate surface activation step using a bombardment with an argon ion beam (IPC) with a starting pressure of $5.10^{-4}$ mBar (the ion gun was set to 1.8 A, 100 V, 60 seconds), stopping the ionic irradiation, and then successively evaporating the required number of layers (sheets (A), (B) and (C), sub-layer, antireflection coating layers and antifouling coating) at a rate ranging from 0.4 to 3 nm/s, and lastly a ventilation step.

Forming an antireflection stack according to the present invention comprises a deposition step of a $ZrO_2$ layer (sheet (A)) at a rate of 1 nm/s under an $O_2$ pressure of $7.0\times10^{-5}$ mBar, a deposition step of a $SiO_2$ layer (sheet (B)) at a rate of 2 nm/s, a deposition step of a $ZrO_2$ layer (sheet (C)) at a rate of 1 nm/s under an $O_2$ pressure of $7.0\times10^{-5}$ mBar, a surface activation step of this $ZrO_2$ layer using an argon ion beam for 30 seconds (same treatment as IPC already conducted directly on the substrate), a deposition step of a $SiO_2$ sub-layer at a rate of 3 nm/s optionally under an $O_2$ atmosphere (at a pressure of $1.6\times10^{-4}$ mBar in example 6 and comparative example 2 where $O_2$ gas was supplied, or $5\times10^{-5}$ mBar in the other examples where no supplementary gas supply was performed), a surface activation step of the sub-layer using an argon ion beam for 30 seconds (same treatment as IPC already conducted directly on the substrate), a deposition step of a HI layer ($ZrO_2$ or $Ta_2O_5$) at a rate of 2 nm/s, a deposition step of a LI layer ($SiO_2$) at a rate of 2 nm/s, a deposition step of a HI layer ($ZrO_2$ or $Ta_2O_5$) at a rate of 2 nm/s, a deposition step of a thin electrically conductive layer (HI, ITO or $SnO_2$) at a rate of 1 nm/s with an oxygen ion assistance (ion gun: 2 A, 120 V), a deposition step of a LI layer ($SiO_2$) at a rate of 2-3 nm/s, and lastly a deposition step of an Optool DSX® layer at a rate of 0.4 nm/s.

Deposition step of HI layers of $ZrO_2$ was done with a gas supply ($O_2$, under a pressure of $7.5\times10^{-5}$ mBar).

Deposition step of HI Layers of $Ta_2O_5$ was done with an oxygen ion assistance (ion gun: 3 A, 130 V) leading to a pressure of about $2\times10^{-4}$ mBar.

In comparative examples 1 and 2, sheet (A) was omitted.

In comparative examples 8, sheets (A) and (B) were omitted.

In comparative example 9, sheets (A), (B) and (C) were omitted.

In comparative example 10, the $Ta_2O_5$ material was used to form sheet (A).

3. Testing Methods

The following test procedures were used to evaluate the optical articles prepared according to the present invention. Several samples for each system were prepared for measurements and the reported data were calculated with the average of the different samples.

Colorimetric measurements (in reflection) of the face coated with the stack of the invention: reflection factor Rv, hue angle h and chroma C* in the international colorimetric CIE (L*, a*, b*) space were carried out with a Zeiss spectrophotometer, taking into account the standard illuminant D65, and the standard observer 10° (for h and C*). They are provided for an angle of incidence of 15°.

$R_{UV}$, RmB1 and RmB2 were computed from the same reflection measurement.

The critical temperature of the article was measured in the manner indicated in patent application WO 2008/001011. It was measured one month after production of the article.

The thickness of the layers was controlled by means of a quartz microbalance.

Abrasion resistance was determined as disclosed in WO 2012/173596. Specifically, abrasion resistance was measured by means of the sand Bayer test, in accordance with the ASTM F735-81 standard, 24h after production of the article.

The adhesion properties of the whole of the interference coating to the substrate were verified on the convex face of the lens by means of the test commonly referred to in French as the "n×10 coups" test (i.e. the "n×10 blows" test) described in international patent applications WO 2010/109154 and WO 99/49097. The test is performed in accordance with ISTM 02-011. Briefly, a sample to be tested is placed in a clamp and covered with a selvyt cloth impregnated with isopropyl alcohol. An eraser positioned on a holder moving in translation is put in contact with the cloth. The eraser is pressed down (force=60 Newtons) on the selvyt cloth placed in contact with the lens. The test consists in the determination, for each sample, of the number of cycles required to cause a defect to appear in the antireflection coating. Therefore, the higher the value obtained in the n×10 blows test (average on 10 samples), the better the adhesion of the interference coating to the optionally coated substrate, i.e., between sheet (A) and the underlying coating or substrate. An article successfully passed the test if there was no defect after 20 cycles.

4. Results

| Example 2 (comparative) Substrate + primer/hard coat | |
|---|---|
| +$SiO_2$ | 28.8 nm |
| $ZrO_2$ (a, b) | 5.3 nm |
| $SiO_2$ (a, b) | 143.3 nm |
| $ZrO_2$ (b) | 19.6 nm |
| $SiO_2$ | 20.6 nm |
| $ZrO_2$ (b) | 87.7 nm |
| ITO | 6.5 nm |
| $SiO_2$ | 78.3 nm |
| Top coat | |
| $R_{TI}$ | 0.87 |
| Sand Bayer | 5 |
| Tc | 72° C. |
| n × 10 blows test | Pass |
| Total thickness | 390.1 nm |

| Example 1 (comparative) Substrate + primer/hard coat | |
|---|---|
| $SiO_2$ | 28.8 nm |
| $ZrO_2$ (a, b) | 5.3 nm |
| $SiO_2$ (a) | 143.3 nm |
| $ZrO_2$ (b) | 19.6 nm |
| $SiO_2$ | 20.6 nm |
| $ZrO_2$ (b) | 87.7 nm |
| ITO | 6.5 nm |
| $SiO_2$ | 78.3 nm |
| Top coat | |
| $R_{TI}$ | 0.87 |
| Sand Bayer | 5.5 |
| Tc | 77° C. |
| n × 10 blows test | Fail |
| Total thickness | 390.1 nm |

| Example 3 Substrate + primer/hard coat | |
|---|---|
| $ZrO_2$ (b) | 12.1 nm |
| $SiO_2$ | 44.9 nm |
| $ZrO_2$ (a, b) | 11.6 nm |
| $SiO_2$ (a) | 143.3 nm |
| $ZrO_2$ (b) | 19.6 nm |
| $SiO_2$ | 20.6 nm |
| $ZrO_2$ (b) | 87.7 nm |
| ITO | 6.5 nm |
| $SiO_2$ | 78.3 nm |
| Top coat | |
| $R_{TI}$ | 0.87 |
| Sand Bayer | 5.8 |
| Tc | 73° C. |
| n × 10 blows test | Pass |
| Total thickness | 424.6 nm |

| Example 4 Substrate + primer/hard coat | |
|---|---|
| $ZrO_2$ (b) | 12.1 nm |
| $SiO_2$ | 44.9 nm |
| $ZrO_2$ (a, b) | 11.6 nm |
| $SiO_2$ (a) | 148.8 nm |
| $ZrO_2$ (a, b) | 25.7 nm |
| $SiO_2$ | 28.6 nm |
| $ZrO_2$ (b) | 45 nm |
| ITO | 6.5 nm |
| $SiO_2$ | 89.3 nm |

| Top coat | |
|---|---|
| $R_{T1}$ | 1.53 |
| Sand Bayer | 7 |
| Tc | 100° C. |
| n × 10 blows test | Pass |
| Total thickness | 412.4 nm |

Example 5
Substrate + primer/hard coat

| | |
|---|---|
| $ZrO_2$ (b) | 12.1 nm |
| $SiO_2$ | 44.9 nm |
| $ZrO_2$ (a, b) | 11.6 nm |
| $SiO_2$ (a) | 148.8 nm |
| $Ta_2O_5$ | 25.7 nm |
| $SiO_2$ | 28.6 nm |
| $Ta_2O_5$ | 45 nm |
| ITO | 6.5 nm |
| $SiO_2$ | 89.3 nm |

| Top coat | |
|---|---|
| $R_{T1}$ | 1.53 |
| Sand Bayer | 6.5 |
| Tc | 100° C. |
| n × 10 blows test | Pass |
| Total thickness | 412.4 nm |

Example 6
Substrate + primer/hard coat

| | |
|---|---|
| $ZrO_2$ (b) | 12.1 nm |
| $SiO_2$ | 44.9 nm |
| $ZrO_2$ (a, b) | 11.6 nm |
| $SiO_2$ (a, b) | 148.8 nm |
| $Ta_2O_5$ | 25.7 nm |
| $SiO_2$ | 28.6 nm |
| $Ta_2O_5$ | 45 nm |
| ITO | 6.5 nm |
| $SiO_2$ | 89.3 nm |

| Top coat | |
|---|---|
| $R_{T1}$ | 1.53 |
| Sand Bayer | 5.7 |
| Tc | 87° C. |
| n × 10 blows test | Pass |
| Total thickness | 412.4 nm |

Example 8 (comparative)
Substrate + primer/hard coat

| | |
|---|---|
| $ZrO_2$ (a, b) | 11.6 nm |
| $SiO_2$ (a, b) | 148.8 nm |
| $Ta_2O_5$ | 25.7 nm |
| $SiO_2$ | 28.6 nm |
| $Ta_2O_5$ | 45 nm |
| ITO | 6.5 nm |
| $SiO_2$ | 89.3 nm |

| Top coat | |
|---|---|
| $R_{T1}$ | 1.53 |
| Sand Bayer | 5.8 |
| Tc | 100° C. |
| n × 10 blows test | Pass |
| Total thickness | 355.4 nm |

Example 9 (comparative)
Substrate + primer/hard coat

| | |
|---|---|
| $SiO_2$ (a) | 148.8 nm |
| $Ta_2O_5$ | 25.7 nm |
| $SiO_2$ | 28.6 nm |
| $Ta_2O_5$ | 45 nm |
| ITO | 6.5 nm |
| $SiO_2$ | 89.3 nm |

| Top coat | |
|---|---|
| $R_{T1}$ | 1.53 |
| Sand Bayer | 5.8 |
| Tc | 110° C. |
| n × 10 blows test | Fail |
| Total thickness | 343.8 nm |

Example 10 (comparative)
Substrate + primer/hard coat

| | |
|---|---|
| $Ta_2O_5$ | 12.1 nm |
| $SiO_2$ | 44.9 nm |
| $Ta_2O_5$ (a) | 11.6 nm |
| $SiO_2$ (a) | 148.8 nm |
| $Ta_2O_5$ | 25.7 nm |
| $SiO_2$ | 28.6 nm |
| $Ta_2O_5$ | 45 nm |
| ITO | 6.5 nm |
| $SiO_2$ | 89.3 nm |

| Top coat | |
|---|---|
| $R_{T1}$ | 1.53 |
| Sand Bayer | 2.3 |
| Tc | 110° C. |
| n × 10 blows test | Fail |
| Total thickness | 412.4 nm |

Example 13 (convex face)
Substrate + primer/hard coat

| | |
|---|---|
| $ZrO_2$ (b) | 13.8 nm |
| $SiO_2$ | 31.2 nm |
| $ZrO_2$ (a, b) | 5.0 nm |
| $SiO_2$ (a) | 224.0 nm |
| $Ta_2O_5$ | 39.0 nm |
| $SiO_2$ | 43.0 nm |
| $Ta_2O_5$ | 49.6 nm |
| $SnO_2$ | 6.5 nm |
| $SiO_2$ | 123.0 nm |

| Top coat | |
|---|---|
| $R_{T1}$ | 1.74 |
| Sand Bayer | 8.3 |
| Tc | 100° C. |
| n × 10 blows test | Pass |
| h (°) | 310 |
| Total thickness | 535.1 nm |

Example 14 (convex face)
Substrate + primer/hard coat

| | |
|---|---|
| $ZrO_2$ (b) | 19.0 nm |
| $SiO_2$ | 68.0 nm |
| $ZrO_2$ (a, b) | 5.0 nm |
| $SiO_2$ (a) | 179.0 nm |
| $Ta_2O_5$ | 39.0 nm |
| $SiO_2$ | 43.0 nm |
| $Ta_2O_5$ | 49.6 nm |
| $SnO_2$ | 6.5 nm |
| $SiO_2$ | 120 nm |

| Top coat | |
|---|---|
| $R_{T1}$ | 1.74 |
| Sand Bayer | 7.1 |
| Tc | 100° C. |
| n × 10 blows test | Pass |
| h (°) | 310 |
| Total thickness | 532.1 nm |

Examples 13 to 17 (concave face)
Substrate + primer/hard coat

| | |
|---|---|
| $ZrO_2$ (b) | 5.5 nm |
| $SiO_2$ | 43.3 nm |
| $ZrO_2$ (a, b) | 8.8 nm |
| $SiO_2$ (a) | 153.4 nm |
| $Ta_2O_5$ | 17.7 nm |
| $SiO_2$ | 43.0 nm |
| $Ta_2O_5$ | 58.6 nm |
| $SnO_2$ | 6.5 nm |
| $SiO_2$ | 7.12 nm |

| Top coat | |
|---|---|
| $R_{T1}$ | 0.81 |
| Sand Bayer | 5.3 |
| Tc | 100° C. |
| n × 10 blows test | Pass |
| h (°) | 135 |
| Total thickness | 416.1 nm |

-continued

Example 15 (convex face)
Substrate + primer/hard coat

| | |
|---|---|
| ZrO$_2$ (b) | 19.0 nm |
| SiO$_2$ | 68.0 nm |
| ZrO$_2$ (a, b) | 5.0 nm |
| SiO$_2$ (a) | 209.0 nm |
| Ta$_2$O$_5$ | 39.0 nm |
| SiO$_2$ | 43.0 nm |
| Ta$_2$O$_5$ | 58.6 nm |
| SnO$_2$ | 6.5 nm |
| SiO$_2$ | 120.3 nm |
| Top coat | |
| $R_{Tl}$ | 1.59 |
| Sand Bayer | 7.9 |
| Tc | 100° C. |
| n × 10 blows test | Pass |
| h (°) | 319 |
| Total thickness | 571.3 nm |

Example 16 (convex face)
Substrate + primer/hard coat

| | |
|---|---|
| ZrO$_2$ (b) | 19 nm |
| SiO$_2$ | 22 nm |
| ZrO$_2$ (a, b) | 18 nm |
| SiO$_2$ (a) | 119 nm |
| Ta$_2$O$_5$ | 33.6 nm |
| SiO$_2$ | 14 nm |
| Ta$_2$O$_5$ | 31.2 nm |
| SnO$_2$ | 6.5 nm |
| SiO$_2$ | 44 nm |
| Top coat | |
| $R_{Tl}$ | 0.81 |
| Sand Bayer | |
| Tc | |
| n × 10 blows test | Pass |
| h (°) | 60 |
| Total thickness | 307.3 nm |

Example 17 (convex face)
Substrate + primer/hard coat

| | |
|---|---|
| ZrO$_2$ (b) | 19 nm |
| SiO$_2$ | 22 nm |
| ZrO$_2$ (a, b) | 18 nm |
| SiO$_2$ (a) | 104 nm |
| Ta$_2$O$_5$ | 12 nm |
| SiO$_2$ | 14 nm |
| Ta$_2$O$_5$ | 58.8 nm |
| SnO$_2$ | 6.5 nm |
| SiO$_2$ | 44 nm |
| Top coat | |
| $R_{Tl}$ | 0.75 |
| Sand Bayer | |
| Tc | |
| n × 10 blows test | Pass |
| h (°) | 75 |
| Total thickness | 298.3 nm |

(a) Ionic bombardment treatment of the layer surface before depositing the next layer.
(b) Oxygen supply during deposition. The pressure was: $1.6 \times 10^{-4}$ mBar for the SiO$_2$ layers and $7.5 \times 10^{-5}$ mBar for the ZrO$_2$ layers.

The invention claimed is:

1. An optical lens comprising:
   a substrate having a front main face and a rear main face, at least one main face of which being successively coated with:
   (A) a first high refractive index sheet having a refractive index higher than 1.55, which does not comprise any Ta$_2$O$_5$ layer;
   (B) a second low refractive index sheet having a refractive index of 1.55 or less in direct contact with the former sheet;
   (C) a third high refractive index sheet having a refractive index higher than 1.55 in direct contact with the former sheet;
   a monolayer sub-layer having a thickness higher than or equal to 100 nm in direct contact with the former sheet (C);
   a multilayer interferential coating comprising a stack of at least one high refractive index layer having a refractive index higher than 1.55 and at least one low refractive index layer having a refractive index of 1.55 or less; and
   said multilayer interferential coating is a multilayer filtering interferential coating that selectively reflects visible light in a range of wavelengths, and the reflection spectrum of said multilayer filtering interferential coating has a reflection peak centered at a wavelength chosen within said range of wavelengths that exhibits a full width at half maximum lower than 150 nm; or
   said multilayer interferential coating is a multilayer filtering interferential coating that selectively transmits visible light in a range of wavelengths, and the transmission spectrum of said multilayer filtering interferential coating has a transmission peak centered at a wavelength chosen within said range of wavelengths that exhibits a full width at half maximum lower than 150 nm;
   wherein a selective reflection corresponds to a maximum of reflection of the multilayer filtering interferential coating locally higher than 5%, as compared to a reflection baseline, and a selective transmission corresponds to a maximum of transmission of the multilayer filtering interferential coating locally higher than 5%, as compared to a transmission baseline.

2. The optical lens of claim 1, wherein the sub-layer has a thickness higher than or equal to 110 nm.

3. The optical lens of claim 1, wherein the deposition of said sub-layer is performed in a vacuum chamber in which no supplementary gas is supplied during said deposition.

4. The optical lens of claim 1, wherein the sub-layer is a SiO$_2$-based layer.

5. The optical lens of claim 1, wherein the multilayer interferential coating comprises at least one Ta$_2$O$_5$-based layer.

6. The optical lens of claim 1, wherein the multilayer interferential coating comprises at least one electrically conductive layer.

7. The optical lens of claim 1, wherein the multilayer interferential coating is an anti-reflection coating.

8. The optical lens of claim 1, wherein the optical lens is an ophthalmic lens.

9. The optical lens of claim 1, wherein the first high refractive index sheet (A) having a refractive index higher than 1.55 is a ZrO$_2$-based layer.

10. The optical lens of claim 1, wherein the second low refractive index sheet (B) having a refractive index of 1.55 or less is a SiO$_2$-based layer.

11. The optical lens of claim 1, wherein the third high refractive index sheet (C) having a refractive index higher than 1.55 comprises at least one material selected from Ta$_2$O$_5$, Nb$_2$O$_5$, PrTiO$_3$, ZrO$_2$ and Y$_2$O$_3$.

12. The optical lens of claim 1, wherein the ratio:

$$R_{Tl} = \frac{\text{sum of the physical thicknesses of the low refractive index layers of the multilayer interferential coating}}{\text{sum of the physical thicknesses of the high refractive index layers of the multilayer interferential coating}}$$

is higher than or equal to 0.8.

13. The optical lens of claim 1, wherein the ratio:

$$R_{T1} = \frac{\text{sum of the physical thicknesses of the low refractive index layers of the multilayer interferential coating}}{\text{sum of the physical thicknesses of the high refractive index layers of the multilayer interferential coating}}$$

is higher than or equal to 1.5.

14. The optical lens of claim 1, wherein the ratio:

$$R_{T1} = \frac{\text{sum of the physical thicknesses of the low refractive index layers of the multilayer interferential coating}}{\text{sum of the physical thicknesses of the high refractive index layers of the multilayer interferential coating}}$$

is higher than or equal to 2.

15. The optical lens of claim 1, wherein the thickness of said second low refractive index sheet (B) having a refractive index of 1.55 or less is lower than or equal to 80 nm.

16. The optical lens of claim 1, wherein the first high refractive index sheet (A) having a refractive index higher than 1.55 and the third high refractive index sheet (C) having a refractive index higher than 1.55 have a thickness lower than or equal to 60 nm.

17. The optical lens of claim 1, wherein the first high refractive index sheet (A) having a refractive index higher than 1.55 and the third high refractive index sheet (C) having a refractive index higher than 1.55 have a thickness lower than or equal to 25 nm.

18. The optical lens of claim 1, wherein said multilayer interferential coating exhibits the following characteristic:
at least one main face of the substrate is coated with a filtering interferential coating that selectively reflects visible light in a range of wavelengths, and the reflection spectrum of said filtering interferential coating has a reflection peak centered at a wavelength chosen within said range of wavelengths that exhibits a full width at half maximum lower than 150 nm; or
at least one main face of the substrate is coated with a filtering interferential coating that selectively transmits visible light in a range of wavelengths, and the transmission spectrum of said filtering interferential coating has a transmission peak centered at a wavelength chosen within said range of wavelengths that exhibits a full width at half maximum lower than 150 nm.

19. A method of manufacturing the optical lens of claim 1, comprising:
providing an optical lens comprising a substrate having a front main face and a rear main face;
depositing onto at least one main face of the substrate, in this order, a first high refractive index sheet (A) having a refractive index higher than 1.55, which does not comprise any Ta$_2$O$_5$ layer, a second low refractive index sheet (B) having a refractive index of 1.55 or less so that it is in direct contact with the former sheet (A), a third high refractive index sheet (C) having a refractive index higher than 1.55 so that it is in direct contact with the former sheet (B), a monolayer sub-layer having a thickness higher than or equal to 100 nm so that it is in direct contact with the former sheet (C), and a multilayer interferential coating comprising a stack of at least one high refractive index layer having a refractive index higher than 1.55 and at least one low refractive index layer having a refractive index of 1.55 or less;

wherein:
said multilayer interferential coating is a multilayer filtering interferential coating that selectively reflects visible light in a range of wavelengths, and the reflection spectrum of said multilayer filtering interferential coating has a reflection peak centered at a wavelength chosen within said range of wavelengths that exhibits a full width at half maximum lower than 150 nm; or
said multilayer interferential coating is a multilayer filtering interferential coating that selectively transmits visible light in a range of wavelengths, and the transmission spectrum of said multilayer filtering interferential coating has a transmission peak centered at a wavelength chosen within said range of wavelengths that exhibits a full width at half maximum lower than 150 nm;
wherein a selective reflection corresponds to a maximum of reflection of the multilayer filtering interferential coating locally higher than 5%, as compared to a reflection baseline, and a selective transmission corresponds to a maximum of transmission of the multilayer filtering interferential coating locally higher than 5%, as compared to a transmission baseline.

20. An optical lens comprising:
a substrate having a front main face and a rear main face, at least one main face of which being successively coated with:
  (A) a first high refractive index sheet having a refractive index higher than 1.55, which does not comprise any Ta$_2$O$_5$ layer;
  (B) a second low refractive index sheet having a refractive index of 1.55 or less in direct contact with the former sheet;
  (C) a third high refractive index sheet having a refractive index higher than 1.55 in direct contact with the former sheet;
a monolayer sub-layer having a thickness higher than or equal to 100 nm in direct contact with the former sheet (C);
a multilayer interferential coating comprising a stack of at least one high refractive index layer having a refractive index higher than 1.55 and at least one low refractive index layer having a refractive index of 1.55 or less; and
a monolayer sub-layer having a thickness higher than or equal to 100 nm in direct contact with the former sheet (C);
a multilayer interferential coating comprising a stack of at least one high refractive index layer having a refractive index higher than 1.55 and at least one low refractive index layer having a refractive index of 1.55 or less; and
at least one main face of the substrate is coated with a filtering interferential coating that selectively reflects visible light in a range of wavelengths, and the reflection spectrum of said filtering interferential coating has a reflection peak centered at a wavelength chosen within said range of wavelengths that exhibits a full width at half maximum lower than 150 nm; or
at least one main face of the substrate is coated with a filtering interferential coating that selectively transmits visible light in a range of wavelengths, and the transmission spectrum of said filtering interferential coating has a transmission peak centered at a wavelength chosen within said range of wavelengths that exhibits a full width at half maximum lower than 150 nm;
wherein said full width at half maximum is lower than 120 nm.

* * * * *